United States Patent
Kamatani et al.

(10) Patent No.: US 11,121,182 B2
(45) Date of Patent: Sep. 14, 2021

(54) ORGANIC PHOTOELECTRIC CONVERSION ELEMENT, OPTICAL AREA SENSOR, IMAGE PICKUP DEVICE, AND IMAGE PICKUP APPARATUS

(71) Applicant: CANON KABUSHIKI KAISHA, Tokyo (JP)

(72) Inventors: Jun Kamatani, Tokyo (JP); Naoki Yamada, Inagi (JP); Hiroki Ohrui, Kawasaki (JP); Kengo Kishino, Tokyo (JP); Hironobu Iwawaki, Yokohama (JP); Satoru Shiobara, Hiratsuka (JP); Tomona Yamaguchi, Tokyo (JP); Masumi Itabashi, Yamato (JP); Yosuke Nishide, Kawasaki (JP); Hirokazu Miyashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 124 days.

(21) Appl. No.: 16/056,270

(22) Filed: Aug. 6, 2018

(65) Prior Publication Data
US 2018/0342559 A1 Nov. 29, 2018

Related U.S. Application Data

(63) Continuation of application No. PCT/JP2017/002692, filed on Jan. 26, 2017.

(30) Foreign Application Priority Data

Feb. 9, 2016 (JP) .............................. JP2016-022603

(51) Int. Cl.
*H01L 31/00* (2006.01)
*H01L 27/30* (2006.01)
(Continued)

(52) U.S. Cl.
CPC .......... *H01L 27/307* (2013.01); *H01L 27/146* (2013.01); *H01L 51/006* (2013.01);
(Continued)

(58) Field of Classification Search
CPC . H01L 51/0032; H01L 27/307; H01L 27/146; H01L 51/0053; H01L 51/0072;
(Continued)

(56) References Cited

U.S. PATENT DOCUMENTS

| | | | |
|---|---|---|---|
| 2009/0015144 A1* | 1/2009 | Takashima | C07C 211/54 313/504 |
| 2013/0174910 A1* | 7/2013 | Yasukawa | H01L 51/424 136/263 |
| 2015/0311445 A1* | 10/2015 | Udaka | H01L 51/0071 257/40 |

FOREIGN PATENT DOCUMENTS

| | | |
|---|---|---|
| JP | 2009-49278 A | 3/2009 |
| JP | 2013-41995 A | 2/2013 |

(Continued)

OTHER PUBLICATIONS

English machine translation of KR 20140021969 (Year: 2020).*
(Continued)

*Primary Examiner* — Angelo Trivisonno
(74) *Attorney, Agent, or Firm* — Canon U.S.A., Inc., IP Division

(57) ABSTRACT

An organic photoelectric conversion element includes an electron-collecting electrode, a hole-collecting electrode, and a photoelectric conversion portion which is disposed between the electron-collecting electrode and the hole-collecting electrode. The photoelectric conversion portion includes a first organic compound layer. A second organic compound layer is disposed between the hole-collecting electrode and the photoelectric conversion portion. The first
(Continued)

organic compound layer contains a first compound having at least a fullerene skeleton and a second compound having a fluoranthene skeleton.

19 Claims, 1 Drawing Sheet

(51) Int. Cl.
*H04N 5/378* (2011.01)
*H01L 51/44* (2006.01)
*H01L 51/00* (2006.01)
*H01L 27/146* (2006.01)
*H01L 51/42* (2006.01)

(52) U.S. Cl.
CPC ...... *H01L 51/0046* (2013.01); *H01L 51/0053* (2013.01); *H01L 51/0054* (2013.01); *H01L 51/0055* (2013.01); *H01L 51/0056* (2013.01); *H01L 51/0072* (2013.01); *H01L 51/441* (2013.01); *H04N 5/378* (2013.01); *H01L 27/14621* (2013.01); *H01L 27/14627* (2013.01); *H01L 51/4273* (2013.01); *Y02E 10/549* (2013.01)

(58) Field of Classification Search
CPC . H01L 51/006; H01L 51/0055; H01L 51/441; H01L 51/0054; H01L 51/0056; H01L 51/0046; H01L 51/4273; H01L 27/14627; H01L 27/14621; H04N 5/378; Y02E 10/549

See application file for complete search history.

(56) References Cited

FOREIGN PATENT DOCUMENTS

| | | |
|---|---|---|
| JP | 2013-236008 A | 11/2013 |
| KR | 20140021969 A * | 2/2014 |
| WO | 2011/093067 A1 | 8/2011 |

OTHER PUBLICATIONS

Kung, Yun-Hua et al., "Synthesis, Structures, and Physical Properties of Benzo[k]fluoranthene-Based Linear Acenes", Chemistry—A European Journal, 2010, vol. 16, Issue 20, pp. 5909-5919.

* cited by examiner

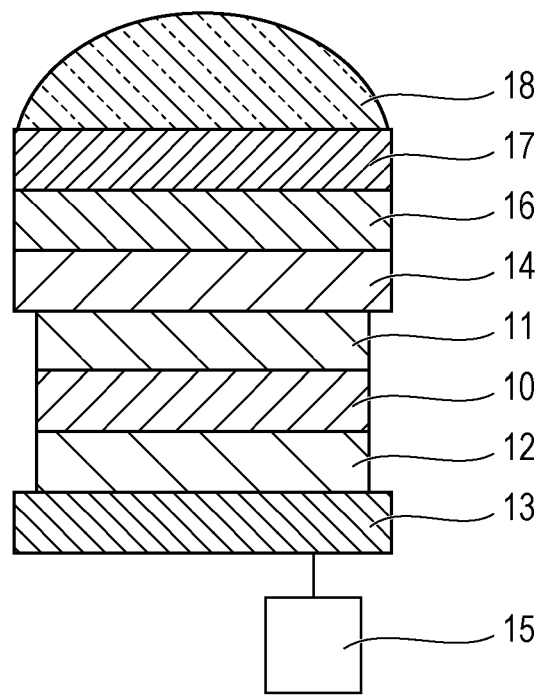

ORGANIC PHOTOELECTRIC CONVERSION ELEMENT, OPTICAL AREA SENSOR, IMAGE PICKUP DEVICE, AND IMAGE PICKUP APPARATUS

CROSS-REFERENCE TO RELATED APPLICATIONS

This application is a Continuation of International Patent Application No. PCT/JP2017/002692, filed Jan. 26, 2017, which claims the benefit of Japanese Patent Application No. 2016-022603, filed Feb. 9, 2016, both of which are hereby incorporated by reference herein in their entirety.

TECHNICAL FIELD

The present invention relates to an organic photoelectric conversion element, and an optical area sensor, an image pickup device, and an image pickup apparatus, each using the organic photoelectric conversion element.

BACKGROUND ART

A planar-type photodetector is widely used as an image pickup device. In the planar-type photodetector, pixels, each having a photoelectric conversion portion, are two-dimensionally arranged in a semiconductor, and electrical signals produced by photoelectric conversion in the individual pixels are charge-transferred and read out by a CCD circuit or CMOS circuit. On the other hand, a photodiode in which an organic compound is used as a constituent material of a photoelectric conversion portion is known. Patent Literature 1 discloses that in order to obtain an organic photoelectric conversion element having good sensitivity, a fullerene and a light-absorbing material are incorporated into a photoelectric conversion layer constituting the element. Furthermore, Patent Literature 2 discloses a solar cell in which a dibenzofluoranthene compound and a fullerene are used.

CITATION LIST

Patent Literature

PTL 1 Japanese Patent Laid-Open No. 2013-236008
PTL 2 International Publication No. 2011/093067

In the organic photoelectric conversion element disclosed in Patent Literature 1, since the molecules of the constituent materials of the photoelectric conversion layer do not have a common partial structure, the efficiency of charge separation in the charge separation process is low, and there is a room for improvement. Regarding the solar cell disclosed in Patent Literature 2, there is also a room for improvement in terms of photoelectric conversion efficiency. The present invention can provide an organic photoelectric conversion element having improved photoelectric conversion efficiency.

SUMMARY

An organic photoelectric conversion element according to the present invention includes an electron-collecting electrode, a hole-collecting electrode, and a photoelectric conversion portion which is disposed between the electron-collecting electrode and the hole-collecting electrode. The photoelectric conversion portion includes a first organic compound layer, and a second organic compound layer is disposed between the hole-collecting electrode and the photoelectric conversion portion. The first organic compound layer contains a first compound having at least a fullerene skeleton and a second compound having a fluoranthene skeleton.

Further features of the present invention will become apparent from the following description of exemplary embodiments with reference to the attached drawing.

BRIEF DESCRIPTION OF DRAWING

FIGURE is a schematic cross-sectional view showing an example of a photoelectric conversion element according to an embodiment of the present invention.

DESCRIPTION OF EMBODIMENTS

An organic photoelectric conversion element according to the present invention includes an electron-collecting electrode, a hole-collecting electrode, and a photoelectric conversion portion which is disposed between the electron-collecting electrode and the hole-collecting electrode. In the present invention, the photoelectric conversion portion includes a first organic compound layer, and a second organic compound layer is disposed between the hole-collecting electrode and the photoelectric conversion portion. Furthermore, in the present invention, the first organic compound layer contains a first compound having at least a fullerene skeleton and a second compound having a fluoranthene skeleton.

1. Characteristics of Organic Photoelectric Conversion Element According to the Present Invention In the organic photoelectric conversion element, the process from photoexcitation to charge separation is important. In order to perform charge separation, molecules that absorb light whose wavelength is in the visible range or the like and become excited as well as molecules that receive excitation energy from the excited molecules and generate charges (holes and electrons) (e.g., molecules having a small rearrangement energy, such as fullerene molecules) are required. Furthermore, in order to perform charge separation efficiently, intermolecular interaction between the two types of molecules is important. Here, in the case where the two types of molecules have a common partial structure, intermolecular interaction is easily induced through the partial structure. Incidentally, aromatic functional groups (aryl groups, heterocyclic groups) have a property to interact with each other. The reason for this is that a dispersion force, i.e., London dispersion force, occurs between aromatic rings in molecules. Because of the London dispersion force, the aromatic rings tend to be stabilized when they have an arrangement that looks like stacked coins. This is also referred to as stacking interaction from the arrangement of the aromatic rings. The effect of the intermolecular interaction tends to increase as the number of $\pi$ electrons of aromatic rings involved in stacking increases, and also increases as the similarity in the structures of the two types of molecules increases.

The present inventors have paid attention to this point. The fullerene skeleton, which is a skeleton generally used in charge separation, has a spherical structure in which a five-membered ring and a six-membered ring are alternately condensed as shown in general formula (A) below. Although the smallest unit of aromatic rings contained in the fullerene is benzene, the present inventors have considered that, in order to produce higher intermolecular interaction, the fluoranthene skeleton shown by general formula (B) below, which is an aromatic ring having a larger number of π electrons than benzene and contains a five-membered ring, is suitable as a basic unit.

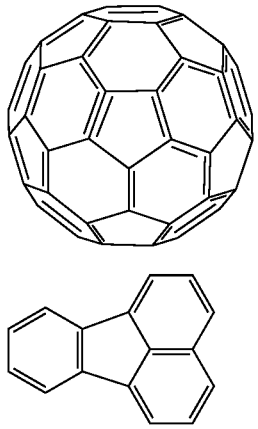

The reason for considering that the fluoranthene skeleton formed by condensing three six-membered rings with one five-membered ring is suitable as a basic unit is that the fluoranthene skeleton has a deep LUMO level (large electron affinity) and high electron acceptability. The LUMO level of a compound having the fullerene skeleton is deep because the fluoranthene skeleton is included in the fullerene skeleton. Therefore, a fluoranthene skeleton, which is one of the basic units of the aromatic rings contained in the fullerene, is incorporated into both molecules that release photo-excited energy and molecules that perform charge separation (generate holes and electrons). The present inventors have found that thereby, intermolecular interaction of these molecules is increased, and charge separation can be performed more efficiently.

The two types of molecules (molecules that release photo-excited energy and molecules that perform charge separation) contained in the organic photoelectric conversion element according to the present invention exhibit intermolecular interaction. Therefore, in the case where the two types of molecules are incorporated into the element, when a voltage is applied to an electrode provided in the element, a current flows even without irradiation with light. This becomes a dark current, which is a significant problem in terms of characteristics of the element. This problem can be solved by providing an electron-blocking layer between the electrode and the photoelectric conversion portion. A dark current is generated because of proximity between the energy level of the electrode and the energy level of the photoelectric conversion portion. Accordingly, in order to eliminate the energy level proximity, the electron-blocking layer is provided between the electrode and the photoelectric conversion portion. Therefore, in the organic photoelectric conversion element according to the present invention, in addition to the photoelectric conversion portion, an electron-blocking layer can be provided between the electrode and the photoelectric conversion portion.

2. Embodiment of Organic Photoelectric Conversion Element

An embodiment of the organic photoelectric conversion element according to the present invention will be described with reference to the drawing.

(1) Overall Structure of Organic Photoelectric Conversion Element

FIGURE is a schematic cross-sectional view showing an example of a photoelectric conversion element according to an embodiment of the present invention. An organic photoelectric conversion element 1 shown in FIGURE includes an electron-collecting electrode (anode) 13, a hole-collecting electrode (cathode) 14, and a first organic compound layer 10 disposed between the electron-collecting electrode 13 and the hole-collecting electrode 14.

The hole-collecting electrode 14 constituting the organic photoelectric conversion element 1 shown in FIGURE is an electrode that collects holes, which are one type of charges generated in the first organic compound layer 10. In the case where the organic photoelectric conversion element of the present invention is used as a constituent member of an image pickup device, the hole-collecting electrode 14 corresponds to a pixel electrode.

The electron-collecting electrode 13 constituting the organic photoelectric conversion element 1 shown in FIGURE is an electrode that collects electrons, which are one type of charges generated in the first organic compound layer 10, as will be described later. In the case where the organic photoelectric conversion element of the present invention is used as a constituent member of an image pickup device, the electron-collecting electrode 13 corresponds to a pixel electrode. In the organic photoelectric conversion element 1 shown in FIGURE, the electron-collecting electrode 13 is arranged closer to a pixel circuit (e.g., readout circuit 15) than the hole-collecting electrode 14. However, in the present invention, the hole-collecting electrode 14 may be arranged closer to the pixel circuit.

In the organic photoelectric conversion element 1 shown in FIGURE, the first organic compound layer 10 contains a compound that is excited when subjected to light. Furthermore, the first organic compound layer 10 also has the role of transporting charges generated after the molecules of the compound are excited by light, i.e., electrons and holes, to the electron-collecting electrode 13 and the hole-collecting electrode 14, respectively. The first organic compound layer 10 contains an organic compound that converts light into charges as will be described later, and therefore, the first organic compound layer 10 is a photoelectric conversion layer or a layer that constitutes a photoelectric conversion portion. However, in the present invention, the photoelectric conversion portion constituting the organic photoelectric conversion element is not limited to first organic compound layer 10 only. A third organic compound layer 12, which will be described later, can also be included in the photoelectric conversion portion.

The first organic compound layer 10 can be a layer that contains a p-type organic semiconductor or n-type organic semiconductor. Moreover, the first organic compound layer 10 can include, at least partially, a bulk heterolayer (mixed layer) containing a p-type organic semiconductor and an n-type organic semiconductor. When the first organic compound layer 10 includes, at least partially, a bulk heterolayer containing a p-type organic semiconductor and an n-type organic semiconductor, it is possible to further improve the photoelectric conversion efficiency (sensitivity) of the element. Furthermore, in forming the first organic compound layer 10, by incorporating the p-type organic semiconductor and the n-type organic semiconductor at a suitable mixing ratio, it is possible to enhance electron mobility and hole mobility inside the first organic compound layer 10, and it is possible to further increase the optical response speed of the organic photoelectric conversion element.

In the present invention, the first organic compound layer 10 can include a single layer, but may include a plurality of layers. Furthermore, in the present invention, the first organic compound layer 10 can be non-luminous. The term being non-luminous means that the luminous quantum efficiency of the layer is 1% or less, preferably 0.5% or less, and more preferably 0.1% or less in the visible light range (wavelength: 400 to 740 mm). In the first organic compound layer 10 serving as the photoelectric conversion portion, if the luminous quantum efficiency exceeds 1%, in the case where the organic photoelectric conversion element of the present invention is used as a constituent member of a sensor or image pickup device, sensing performance or image pickup performance will be affected, which is not desirable.

The details of the two compounds contained in the first organic compound layer 10, i.e., the first compound having a fullerene skeleton and the second compound having a fluoranthene skeleton will be described later.

In the organic photoelectric conversion element 1 shown in FIGURE, a second organic compound layer 11 is disposed between the hole-collecting electrode 14 and the first organic compound layer 10. In the present invention, the second organic compound layer 11 may include a single layer or a plurality of layers. Furthermore, the second organic compound layer 11 may be a bulk heterolayer (mixed layer) containing multiple materials. In the organic photoelectric conversion element 1 shown in FIGURE, the second organic compound layer 11 has the role of transporting the holes transferred from the first organic compound layer 10 to the hole-collecting electrode 14. Furthermore, the second organic compound layer 11 suppresses electrons from being transferred from the hole-collecting electrode 14 to the photoelectric conversion portion. That is, the second organic compound layer 11 functions as a hole-transporting layer or electron-blocking layer and is a constituent member suitable for solving the problem of dark current described above. The second organic compound layer 11 can be in contact with the hole-collecting electrode 14.

In the present invention, as shown in FIGURE, a third organic compound layer 12 may be provided between the electron-collecting electrode 13 and the first organic compound layer 10. The third organic compound layer 12 is a layer provided between the first organic compound layer 10 and the electron-collecting electrode 13. In the organic photoelectric conversion element 1 shown in FIGURE, the third organic compound layer 12 has the role of transporting electrons transferred from the first organic compound layer 10 to the electron-collecting electrode 13. Furthermore, the third organic compound layer 12 is a layer (hole-blocking layer) that suppresses holes from flowing from the electron-collecting electrode 13 into the first organic compound layer 10 and, therefore, can be a layer having a high ionization potential. In the case where the third organic compound layer 12 is provided as shown in FIGURE, the third organic compound layer 12 may include a single layer or a plurality of layers. Furthermore, the third organic compound layer 12 may be a bulk heterolayer (mixed layer) containing multiple materials. Furthermore, in the present invention, as shown in FIGURE, the third organic compound layer 12 can be disposed between the first organic compound layer 10 and the electron-collecting electrode 13 and in contact with the first organic compound layer 10.

In the present invention, layers to be disposed between the electron-collecting electrode 13 and the hole-collecting electrode 14 are not limited to the above-described three layers (the first organic compound layer 10, the second organic compound layer 11, and the third organic compound layer 12). An intervening layer can be further provided between the organic compound layer and the hole-collecting electrode 14 or between the organic compound layer and the electron-collecting electrode 13. The intervening layer is provided for the purpose of improving injection efficiency of charges in injecting the generated charges into the electrode or blocking charges from being injected into the organic compound layer in applying charges. In the case where the intervening layer is provided, the intervening layer may be an organic compound layer containing an organic compound or an inorganic compound layer containing an inorganic compound.

In the organic photoelectric conversion element 1 shown in FIGURE, the electron-collecting electrode 13 is connected to a readout circuit 15. However, the readout circuit 15 may be connected to the hole-collecting electrode 14. The readout circuit 15 has the role of reading out information based on charges generated in the first organic compound layer 10 and conveying the information, for example, to a signal processing circuit (not shown) disposed in the subsequent stage. The readout circuit 15 includes, for example, a transistor that outputs signals based on charges generated in the organic photoelectric conversion element 1.

In the organic photoelectric conversion element 1 shown in FIGURE, an inorganic protective layer 16 is disposed on the hole-collecting electrode 14. The inorganic protective layer 16 is a layer for protecting a member formed by stacking the electron-collecting electrode 13, the third organic compound layer 12, the first organic compound layer 10, the second organic compound layer 11, and the hole-collecting electrode 14 in this order. The constituent material of the inorganic protective layer 16 is, for example, silicon oxide, silicon nitride, aluminum oxide, or the like. The inorganic protective layer 16 can be formed by a known film forming method.

In the organic photoelectric conversion element 1 shown in FIGURE, a color filter 17 is disposed on the inorganic protective layer 16. The color filter 17 may be, for example, a color filter that transmits red light among visible light. Furthermore, in the present invention, one color filter 17 may be provided for each organic photoelectric conversion element, or one color filter 17 may be provided for a plurality of organic photoelectric conversion elements. Furthermore, in arranging color filters 17, for example, adjacent organic photoelectric conversion elements may be arranged in a Bayer array. In the organic photoelectric conversion element 1 shown in FIGURE, an optical member such as a microlens 18 is disposed on the color filter 17. The microlens 18 has the role of condensing incident light on the first organic compound layer 10 which is the photoelectric conversion portion. Furthermore, in the present invention, one microlens 18 may be provided for each organic photoelectric conversion element, or one microlens 18 may be provided for a plurality of organic photoelectric conversion elements. In the present invention, in particular, one microlens 18 can be provided for each organic photoelectric conversion element.

In the organic photoelectric conversion element of the present invention, when photoelectric conversion is performed, a voltage can be applied between the hole-collecting electrode 14 and the electron-collecting electrode 13. The voltage to be applied between the electrodes, although depending on the total thickness of the organic compound layers (10, 11, and 12), is preferably 1 to 15 V, and more preferably 2 to 10 V.

(2) Constituent Materials of Organic Photoelectric Conversion Element

Constituent materials of the organic photoelectric conversion element of the present invention will be described below.

(2a) Substrate

Although not shown in FIGURE, the organic photoelectric conversion element of the present invention may include a substrate. As the substrate, for example, a silicon substrate, a glass substrate, a flexible substrate, or the like may be used.

(2b) Hole-Collecting Electrode

The constituent material of the hole-collecting electrode 14 is not particularly limited as long as it has high conductivity and transparency.

Specific examples thereof include metals, metal oxides, metal nitrides, metal borides, organic conductive compounds, and mixtures obtained by combining two or more of these materials. More specific examples thereof include conductive metal oxides, such as antimony- or fluorine-doped tin oxide (ATO or FTO), tin oxide, zinc oxide, indium oxide, indium tin oxide (ITO), and indium zinc oxide; metal materials, such as gold, silver, chromium, nickel, titanium, tungsten, and aluminum; and conductive compounds, such as oxides and nitrides of these metal materials (e.g., titanium nitride (TiN)), and further include mixtures or laminates of these metals and conductive metal oxides; inorganic conductive substances, such as copper iodide and copper sulfide; organic conductive materials, such as polyaniline, polythiophene, and polypyrrole; and laminates of these and ITO or titanium nitride. In particular, the constituent material of the hole-collecting electrode 14 can be a material selected from the group consisting of titanium nitride, molybdenum nitride, tantalum nitride, and tungsten nitride.

(2c) Electron-Collecting Electrode

As the constituent material of the electron-collecting electrode 13, specifically, ITO, indium zinc oxide, $SnO_2$, ATO (antimony-doped tin oxide), ZnO, AZO (Al-doped zinc oxide), GZO (gallium-doped zinc oxide), $TiO_2$, FTO (fluorine-doped tin oxide), or the like may be used.

The method for forming each of the two electrodes (13 and 14) can be appropriately selected in view of appropriateness with the electrode material to be used. Specifically, the electrodes can be formed by using a method selected from the group consisting of wet methods, such as printing methods and coating methods; physical methods, such as vacuum vapor deposition methods, sputtering methods, and ion plating methods; and chemical methods, such as CVD and plasma CVD methods.

In the case where the electrodes (13 and 14) are formed by using ITO, the electrodes can be formed by an electron beam method, a sputtering method, a resistance heating vapor deposition method, a chemical reaction method (e.g., a sol-gel method), a method of coating with a dispersion of indium tin oxide, or the like. In such a case, the surfaces of the resulting electrodes (ITO electrodes) may be subjected to UV-ozone treatment, plasma treatment, or the like. In the case where the electrodes (13 and 14) are formed by using TiN, various film forming methods, including a reactive sputtering method, can be used. In such a case, the resulting electrodes (TiN electrodes) may be subjected to annealing treatment, UV-ozone treatment, plasma treatment, or the like.

(2d) First organic compound layer

In the present invention, the first organic compound layer 10 Constituting the Organic Photoelectric conversion element contains a first compound having a fullerene skeleton and a second compound having a fluoranthene skeleton. Thus, the first organic compound layer 10 contains a plurality of organic compounds. The first organic compound layer 10 may be a layer in which the first compound and the second compound are mixed. Furthermore, the first organic compound layer 10 may be a laminate in which a layer containing the first compound and a layer containing the second compound are stacked. In the case where the first organic compound layer 10 is a laminate in which a layer containing the first compound and a layer containing the second compound are stacked, the plurality of layers constituting the laminate can be stacked in a direction from the electron-collecting electrode 14 toward the hole-collecting electrode 13.

The first organic compound layer 10 serving as the photoelectric conversion portion contains a material that mainly absorbs light whose wavelength is in the visible range and a material that performs charge separation (generation of electrons and holes). In the present invention, the material that mainly absorbs light whose wavelength is in the visible range is, for example, the second compound having a fluoranthene skeleton. However, in the present invention, a compound other than the second compound may be used, together with the second compound, as the material that mainly absorbs light whose wavelength is in the visible range. Furthermore, in the present invention, the material that performs charge separation is the first compound having at least a fullerene skeleton. However, in the present invention, a compound other than the first compound may be used, together with the first compound, as the material that performs charge separation.

(First Compound)

Here, the first compound having a fullerene skeleton contained in the first organic compound layer 10 will be described. As described above, the fullerene, which is the skeleton possessed by the first compound contained in the first organic compound layer 10, is a general term for a closed-shell, hollow cluster consisting of only many carbon atoms. Specific examples of the fullerene include C60 and higher fullerenes, C70, C74, C76, C78, and the like. Furthermore, the first compound includes not only the fullerene but also a fullerene derivative obtained by introducing a substituent, such as an alkyl group, aryl group, or heterocyclic group, into a fullerene. In the following description, a fullerene and a fullerene derivative may be collectively referred to as "fullerenes". One compound may be selected and used from these compounds, or two or more compounds may be selected and used. All of these fullerenes have fluoranthene skeletons and have the role of performing charge separation and transporting electrons. In addition, even in compounds other than the fullerene, a compound having one or more fluoranthene skeletons can have the role of transporting electrons. Here, a compound having two or more fluoranthene skeletons has higher electron acceptability than that of a compound having one fluoranthene skeleton, and thus, the electron transport effect is increased. The fullerene is a compound having many fluoranthene skeletons and, therefore, is particularly suitable as a material that transports electrons.

The fullerenes contained in the first organic compound layer 10 can be used as an n-type organic semiconductor. Furthermore, since fluoranthene skeletons are stacked on each other in the molecules of fullerenes, the molecules can be aligned (oriented) in a certain direction within the first organic compound layer 10. Thereby, electron paths are formed and the electron transport property is improved, resulting in improvement in the high-speed responsiveness of the organic photoconductive element. The content of fullerenes in the first organic compound layer 10 is preferably 30% to 70% by volume relative to the entire first organic compound layer 10.

Examples of fullerenes (a fullerene and a fullerene derivative) that can be used as the first compound include fullerene C60, fullerene C70, fullerene C76, fullerene C78, fullerene C80, fullerene C82, fullerene C84, fullerene C90, fullerene C96, fullerene C240, fullerene 540, mixed fullerenes, fullerene nanotubes, and fullerene derivatives shown below.

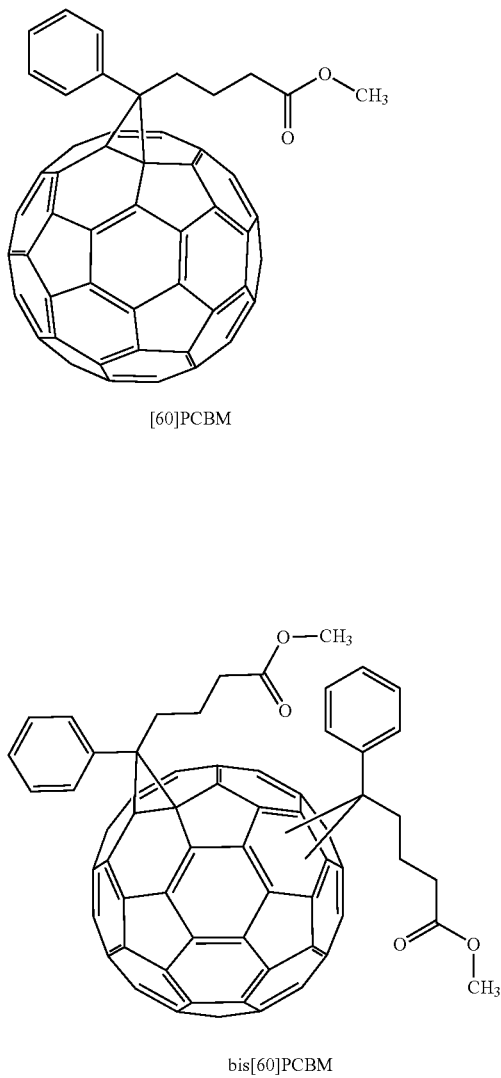

[60]PCBM bis[60]PCBM

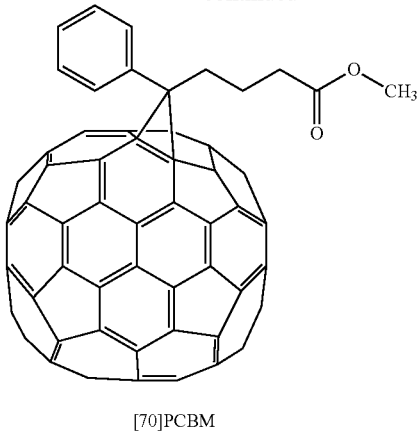

[70]PCBM

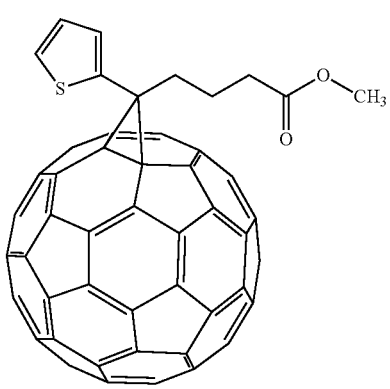

[60]ThCBM

Among these fullerenes, fullerene C60 is suitable.

(Second Compound)

The second compound having a fluoranthene skeleton contained in the first organic compound layer 10 will be described below. In the present invention, a compound corresponding to the second compound has a fluoranthene skeleton, and can be a compound represented by any one of general formulas (1) to (17) below.

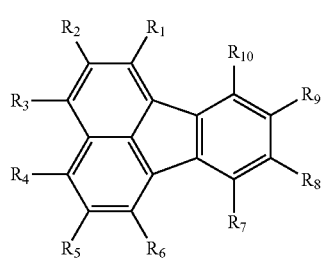

(1)

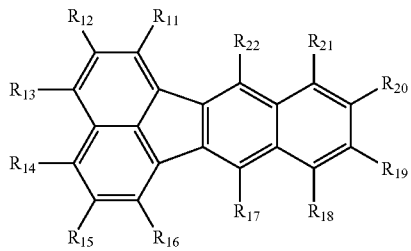

(2)

(3)
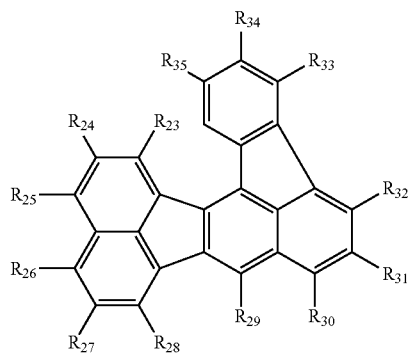
(4)
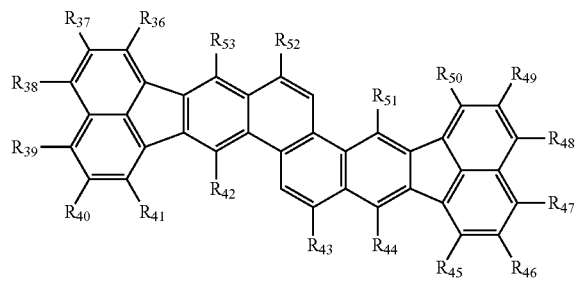
(5)
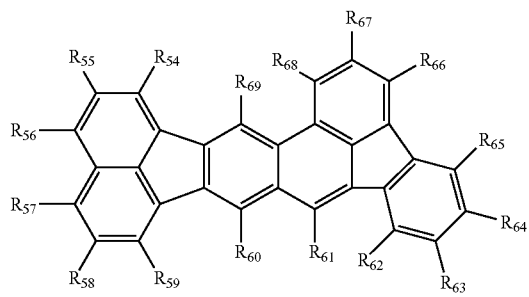
(6)
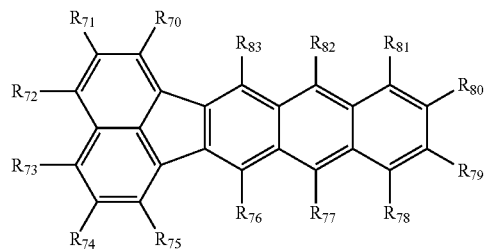
(7)
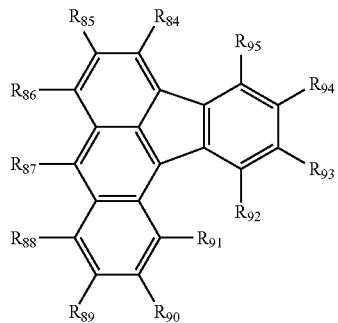
(8)
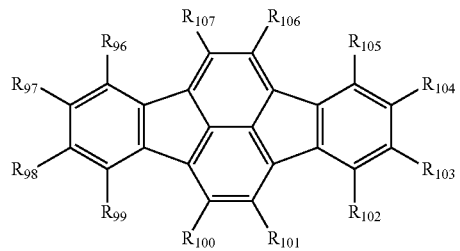
(9)
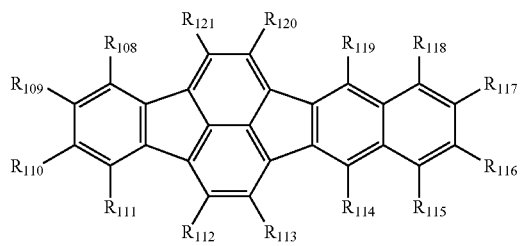
(10)
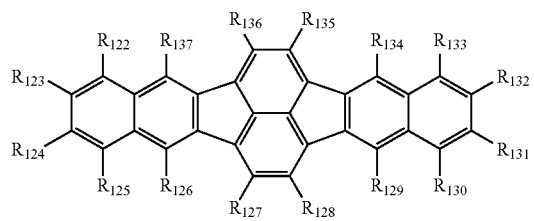
(11)
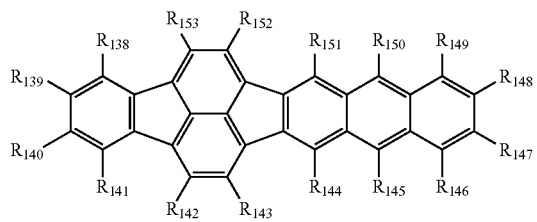
(12)
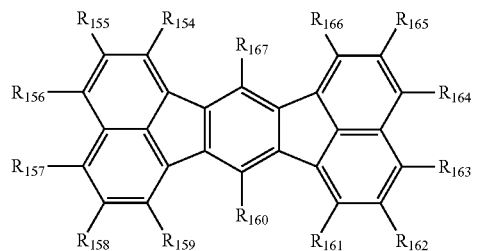

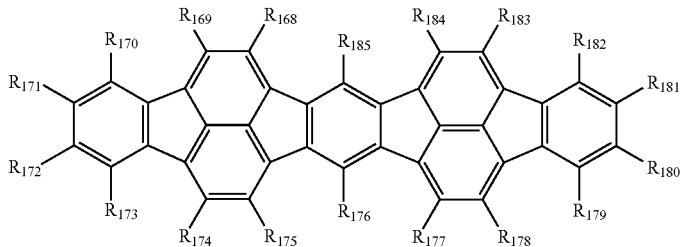

(13)

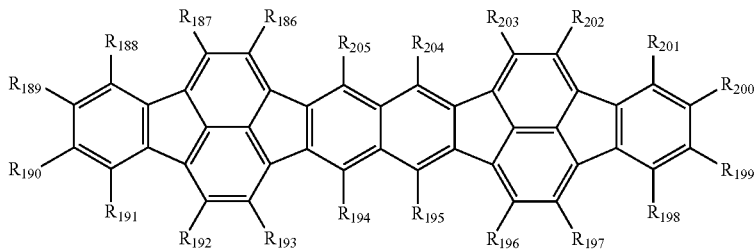

(14)

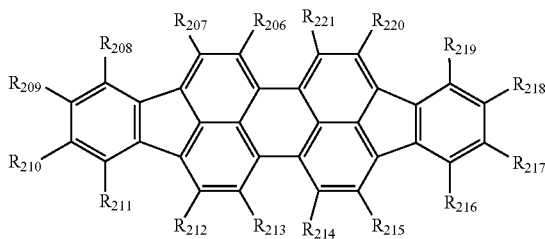

(15)

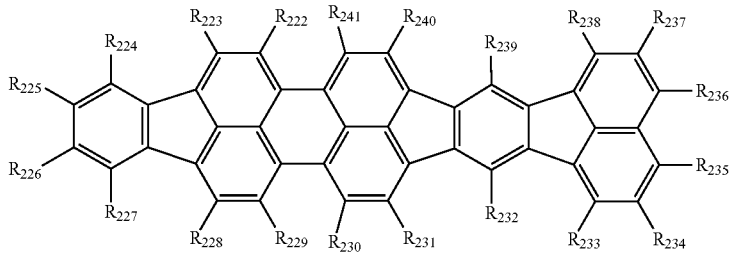

(16)

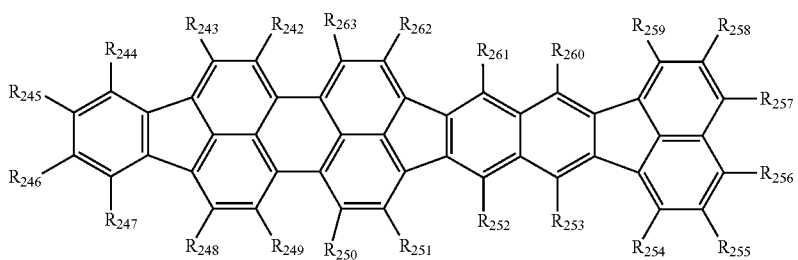

(17)

In formula (1), $R_1$ to $R_{10}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

(I)

The details of the vinyl group represented by general formula (I) will be described later.

Examples of the alkyl group represented by $R_1$ to $R_{10}$ include a methyl group, an ethyl group, a normal propyl group, an isopropyl group, a normal butyl group, a tertiary butyl group, a secondary butyl group, an octyl group, a 1-adamantyl group, and a 2-adamantyl group, but are not limited thereto.

Examples of the aryl group represented by $R_1$ to $R_{10}$ include a phenyl group, a naphthyl group, an indenyl group, a biphenyl group, a terphenyl group, a fluorenyl group, an anthracenyl group, a pyrenyl group, and a perylenyl group, but are not limited thereto.

Examples of the heterocyclic group represented by $R_1$ to $R_{10}$ include a pyridyl group, a pyrazyl group, a triazyl group, a thienyl group, a furanyl group, an oxazolyl group, an oxadiazolyl group, a thiazolyl group, a thiadiazolyl group, a carbazolyl group, an acridinyl group, a phenanthrolyl group, a benzothiophenyl group, and a dibenzothiophenyl group, but are not limited thereto.

Examples of the amino group represented by $R_1$ to $R_{10}$ include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N,N-di-(4-tert-butylphenyl)amino group, an N-methyl-N-phenylamino group, an N,N-dianisolylamino group, an N-mesityl-N-phenylamino group, an N,N-dimesitylamino group, an N-phenyl-N-(4-tert-butylphenyl)amino group, an N-phenyl-N-(4-trifluoromethylphenyl)amino group, and an N-naphthyl-N-phenylamino group, but are not limited thereto.

Examples of the substituent which may be possessed by the alkyl group, the aryl group, the heterocyclic group, and the amino group include alkyl groups, such as a methyl group, an ethyl group, a propyl group, and a tertiary butyl group; aralkyl groups, such as a benzyl group; aryl groups, such as a phenyl group, a biphenyl group, and a naphthyl group; heterocyclic groups, such as a pyridyl group and a pyrrolyl group; amino groups, such as a dimethylamino group, a diethylamino group, a dibenzylamino group, a diphenylamino group, a ditolylamino group, and an N,N-di-(4-tert-butylphenyl)amino group; alkoxy groups, such as a methoxyl group, an ethoxyl group, and a propoxyl group; aryloxy groups, such as a phenoxyl group; halogen atoms, such as fluorine, chlorine, bromine, and iodine; and a cyano group, but are not limited thereto.

A description will be made below on the vinyl group represented by general formula (I) which is represented by $R_1$ to $R_{10}$. In formula (I), $R_a$, $R_b$, and $R_c$ each represent a hydrogen atom, an alkyl group such as methyl, ethyl, propyl, or tertiary butyl group, an aralkyl group such as benzyl group, an aryl group such as phenyl, biphenyl, or naphthyl group, a heterocyclic group such as pyridyl or pyrrolyl group, an amino group such as dimethylamino, diethylamino, dibenzylamino, diphenylamino, ditolylamino, or N,N-di-(4-tert-butylphenyl)amino group, an alkoxy group such as methoxyl, ethoxyl, or propoxyl group, an aryloxy group such as phenoxyl group, a halogen atom such as fluorine, chlorine, bromine, or iodine, a cyano group, or a partial structure represented by general formula (II) or (III) below.

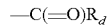 (II)

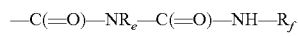 (III)

(In formulas (II) and (III), $R_d$ to $R_f$ each represent a hydrogen atom, an alkyl group such as methyl, ethyl, propyl, or tertiary butyl group, an aralkyl group such as benzyl group, an aryl group such as phenyl, biphenyl, or naphthyl group, a heterocyclic group such as pyridyl or pyrrolyl group, an amino group such as dimethylamino, diethylamino, dibenzylamino, diphenylamino, ditolylamino, or N,N-di-(4-tert-butylphenyl)amino group, an alkoxy group such as methoxyl, ethoxyl, or propoxyl group, an aryloxy group such as phenoxyl group, a halogen atom such as fluorine, chlorine, bromine, or iodine, or a cyano group. In the case where any substituent of $R_d$ to $R_f$ is an alkyl group, an aralkyl group, an aryl group, a heterocyclic group, an amino group, an alkoxy group, or an aryloxy group, the substituent may further have an alkyl group such as methyl, ethyl, propyl, or tertiary butyl group, an aralkyl group such as benzyl group, an aryl group such as phenyl, biphenyl, or naphthyl group, a heterocyclic group such as pyridyl or pyrrolyl group, an amino group such as dimethylamino, diethylamino, dibenzylamino, diphenylamino, ditolylamino, or N,N-di-(4-tert-butylphenyl)amino group, an alkoxy group such as methoxyl, ethoxyl, or propoxyl group, an aryloxy group such as phenoxyl group, a halogen atom such as fluorine, chlorine, bromine, or iodine, or a cyano group.) Note that, in the present invention, at least two substituents among $R_a$, $R_b$, and $R_c$, for example, $R_b$ and $R_c$ may combine to form a ring structure.

In the present invention, the vinyl group can be a substituent represented by any one of general formulas (21) to (25) below.

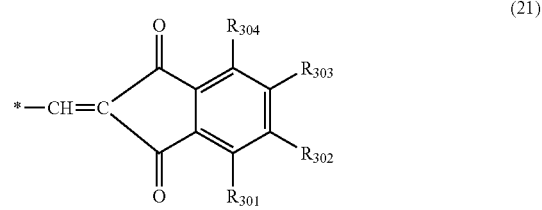 (21)

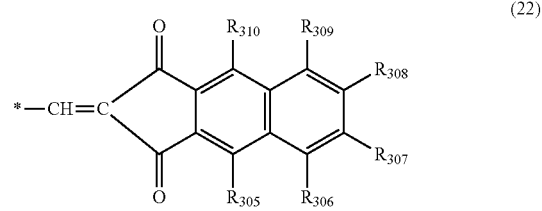 (22)

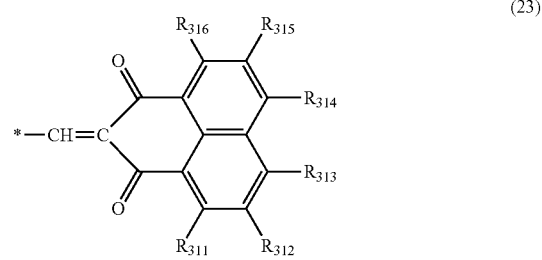 (23)

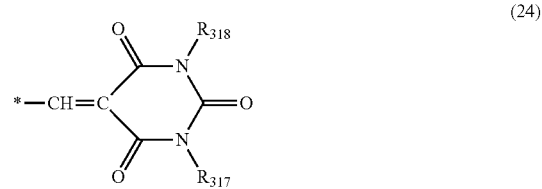 (24)

 (25)

In formula (21), the asterisk represents a bond. $R_{301}$ to $R_{304}$ each represent a hydrogen atom, an alkyl group such as methyl, ethyl, propyl, or tertiary butyl group, an aralkyl group such as benzyl group, an aryl group such as phenyl, biphenyl, or naphthyl group, a heterocyclic group such as pyridyl or pyrrolyl group, an amino group such as dimethylamino, diethylamino, dibenzylamino, diphenylamino, ditolylamino, or N,N-di-(4-tert-butylphenyl)amino group, an alkoxy group such as methoxyl, ethoxyl, or propoxyl group, an aryloxy group such as phenoxyl group, a halogen atom such as fluorine, chlorine, bromine, or iodine, or a cyano group.

In formula (22), the asterisk represents a bond. $R_{305}$ to $R_{310}$ each represent a hydrogen atom, an alkyl group, an aralkyl group, an aryl group, a heterocyclic group, an amino group, an alkoxy group, an aryloxy group, a halogen atom, or a cyano group. Specific examples of the alkyl group, the aralkyl group, the aryl group, the heterocyclic group, the amino group, the alkoxy group, the aryloxy group, and the halogen atom represented by $R_{305}$ to $R_{310}$ are the same as the specific examples of $R_{301}$ to $R_{304}$ in formula (21).

In formula (23), the asterisk represents a bond. $R_{311}$ to $R_{316}$ each represent a hydrogen atom, an alkyl group, an aralkyl group, an aryl group, a heterocyclic group, an amino group, an alkoxy group, an aryloxy group, a halogen atom, or a cyano group. Specific examples of the alkyl group, the aralkyl group, the aryl group, the heterocyclic group, the amino group, the alkoxy group, the aryloxy group, and the halogen atom represented by $R_{311}$ to $R_{316}$ are the same as the specific examples of $R_{301}$ to $R_{304}$ in formula (21).

In formula (24), the asterisk represents a bond. $R_{317}$ and $R_{318}$ each represent a hydrogen atom, an alkyl group, an aralkyl group, an aryl group, a heterocyclic group, an amino group, an alkoxy group, an aryloxy group, a halogen atom, or a cyano group. Specific examples of the alkyl group, the aralkyl group, the aryl group, the heterocyclic group, the amino group, the alkoxy group, the aryloxy group, and the halogen atom represented by $R_{317}$ and $R_{318}$ are the same as the specific examples of $R_{301}$ to $R_{304}$ in formula (21).

In formula (25), the asterisk represents a bond. $R_{319}$ to $R_{321}$ each represent a hydrogen atom, an alkyl group, an aralkyl group, an aryl group, a heterocyclic group, an amino group, an alkoxy group, an aryloxy group, a halogen atom, or a cyano group. Specific examples of the alkyl group, the aralkyl group, the aryl group, the heterocyclic group, the amino group, the alkoxy group, the aryloxy group, and the halogen atom represented by $R_{319}$ to $R_{321}$ are the same as the specific examples of $R_{301}$ to $R_{304}$ in formula (21).

Specific examples of the vinyl groups shown in general formulas (21) to (24) will be shown below. However, in the present invention, the vinyl group shown in any one of general formulas (21) to (24) is not limited to these specific examples. Note that the asterisk in the chemical formulas represents a bond.

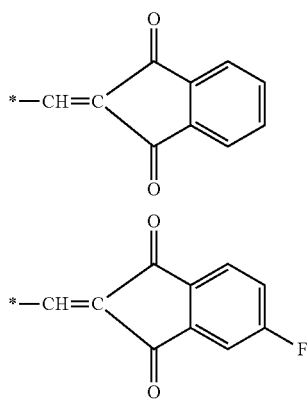

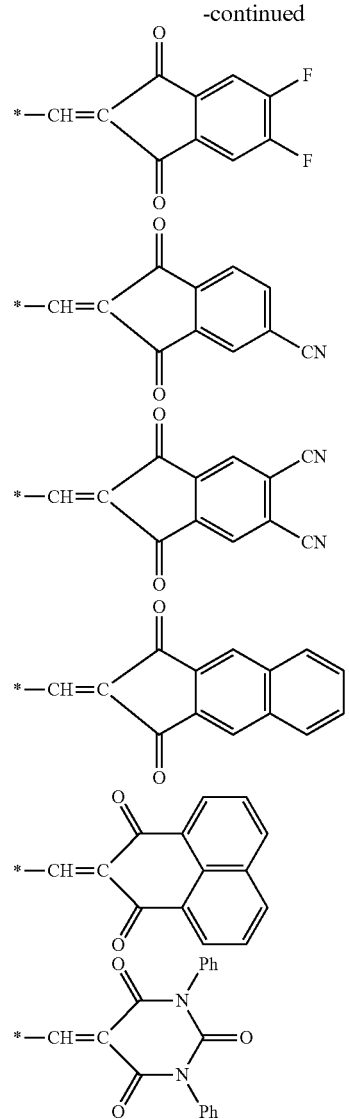

In formula (2), $R_{11}$ to $R_{22}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{11}$ to $R_{22}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (3), $R_{23}$ to $R_{35}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_aCR_bR_c \quad (I)$$

Specific examples of the alkyl group, the aryl group, the heterocyclic group, and the amino group represented by $R_{23}$ to $R_{35}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (4), $R_{36}$ to $R_{53}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{36}$ to $R_{53}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (5), $R_{54}$ to $R_{69}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{54}$ to $R_{69}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (6), $R_{70}$ to $R_{83}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{70}$ to $R_{83}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (7), $R_{84}$ to $R_{95}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{84}$ to $R_{95}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (8), $R_{96}$ to $R_{107}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{96}$ to $R_{107}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (9), $R_{108}$ to $R_{121}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{108}$ to $R_{121}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (10), $R_{122}$ to $R_{137}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{122}$ to $R_{137}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (11), $R_{138}$ to $R_{153}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{138}$ to $R_{153}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (12), $R_{154}$ to $R_{167}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

$$-CR_a=CR_bR_c \quad (I)$$

Specific examples of the alkyl group, the aryl group, the heterocyclic group, and the amino group represented by $R_{154}$ to $R_{167}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (13), $R_{168}$ to $R_{185}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

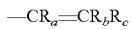  (I)

Specific examples of the alkyl group, the aryl group, the heterocyclic group, and the amino group represented by $R_{168}$ to $R_{185}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (14), $R_{186}$ to $R_{205}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

  (I)

Specific examples of the alkyl group, the aryl group, the heterocyclic group, and the amino group represented by $R_{186}$ to $R_{205}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (15), $R_{206}$ to $R_{221}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

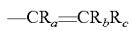  (I)

Specific examples of the alkyl group, the aryl group, the heterocyclic group, and the amino group represented by $R_{206}$ to $R_{221}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (16), $R_{222}$ to $R_{241}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

  (I)

Specific examples of the alkyl group, the aryl group, the heterocyclic group, and the amino group represented by $R_{222}$ to $R_{241}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In formula (17), $R_{242}$ to $R_{263}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group.

  (I)

Specific examples of the alkyl group, the aryl group, the heterocyclic group, and the amino group represented by $R_{242}$ to $R_{263}$, the substituent which may be possessed by the alkyl group, the aryl group, the heterocyclic group, and the amino group, and the substituents ($R_a$, $R_b$, and $R_c$) in formula (I) are the same as the specific examples of $R_1$ to $R_{10}$ in formula (1).

In the present invention, the organic compounds represented by any one of general formulas (1) to (17), which are used as the second compound, may be used alone or in combination of two or more.

Specific examples of the second compound having a fluoranthene skeleton will be shown below. However, in the present invention, it is to be understood that the second compound is not limited to the specific examples shown below.

[Group of compounds of formula (1)]

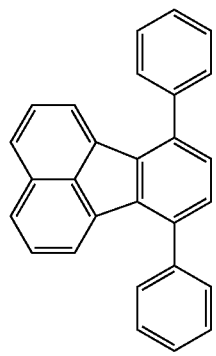

A1

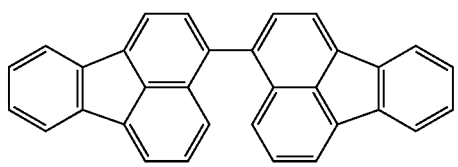

A2

-continued
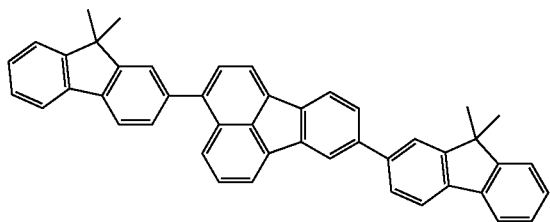
A3
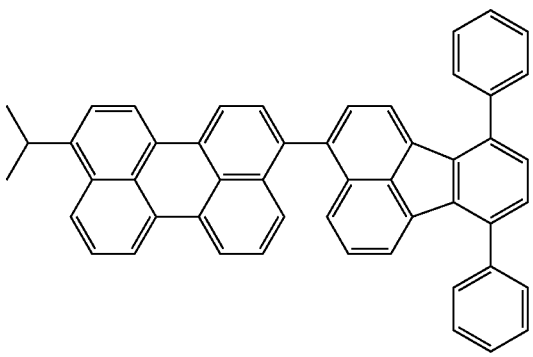
A4
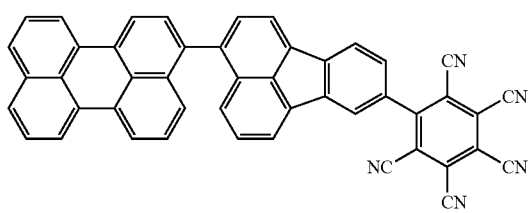
A5
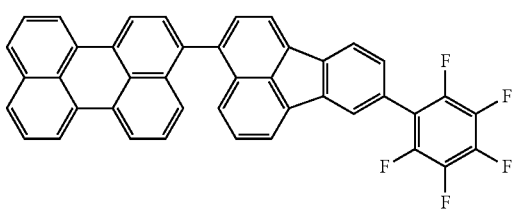
A6
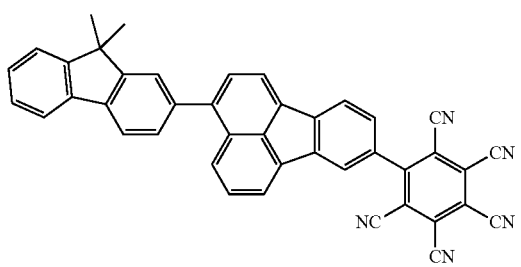
A7
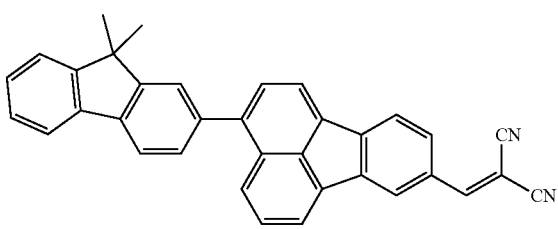
A8
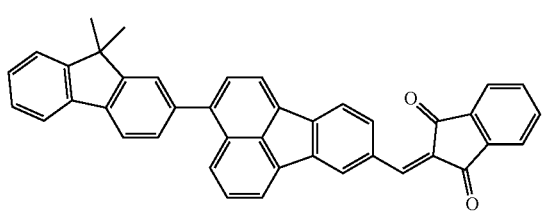
A9
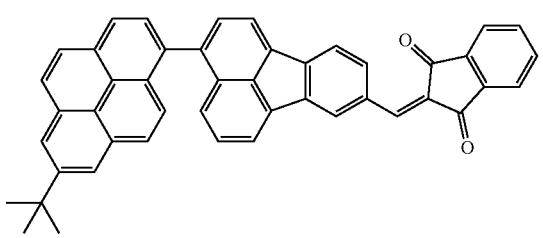
A10
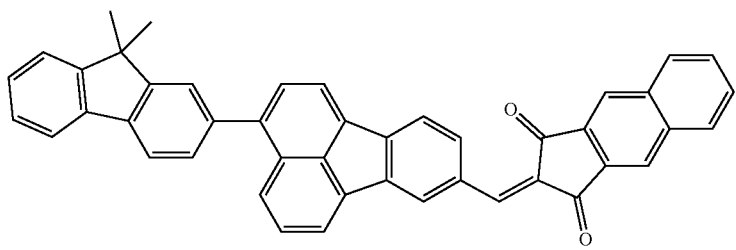
A11

-continued
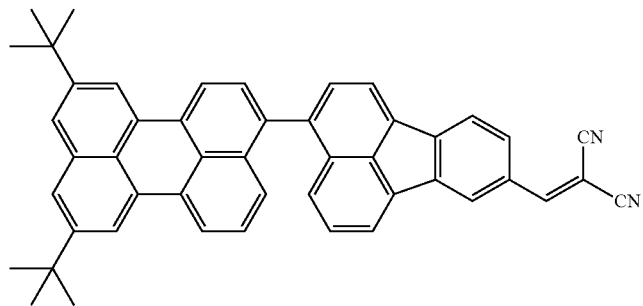
A12
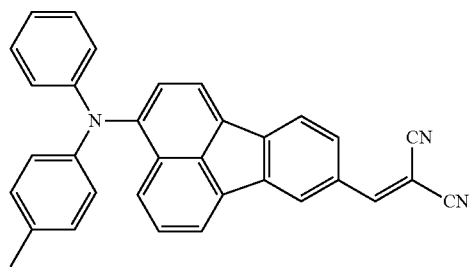
A13
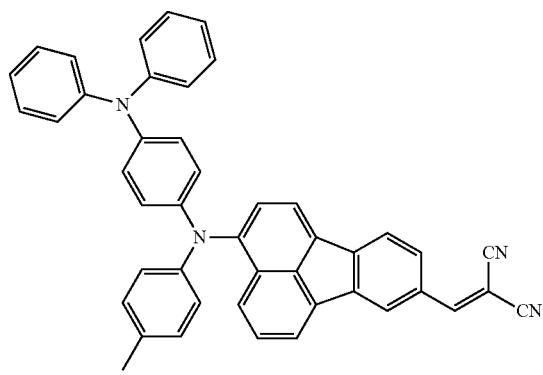
A14
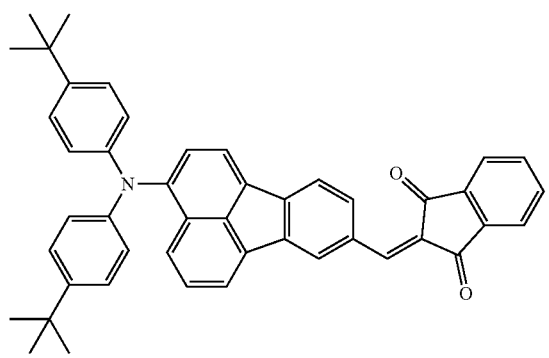
A15
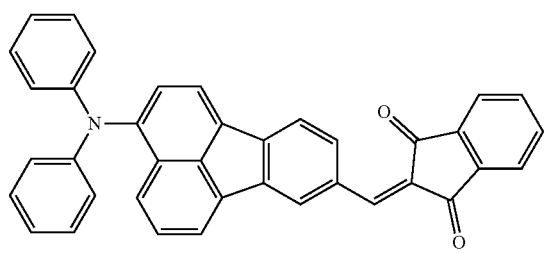
A16
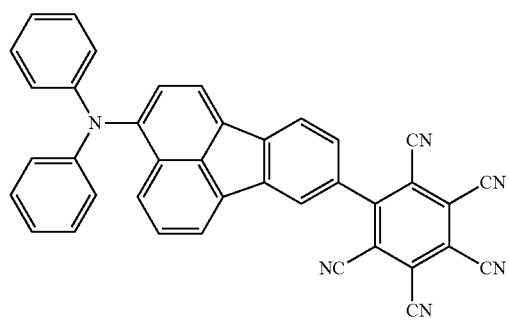
A17
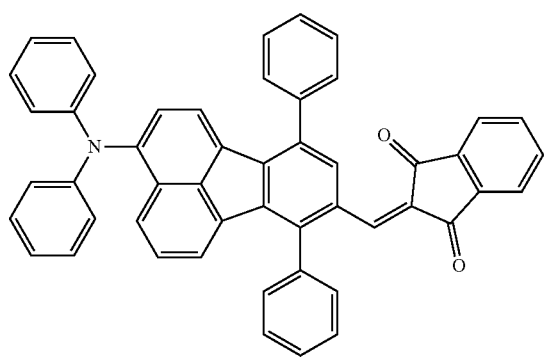
A18

A19
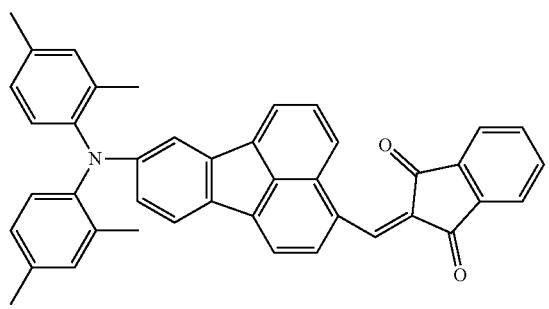
A20
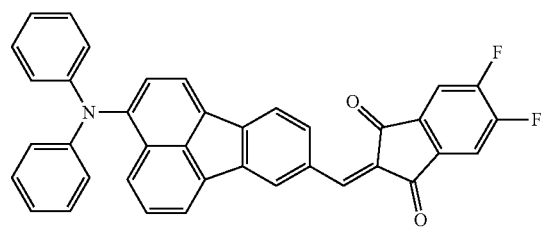
A21
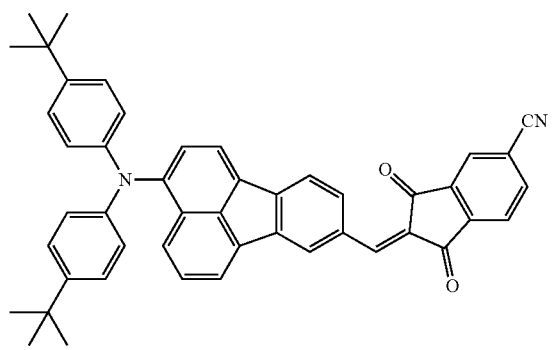
A22
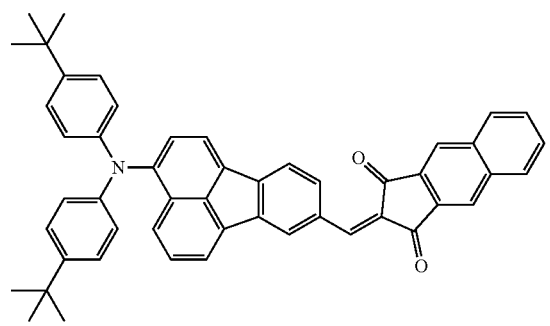
A23
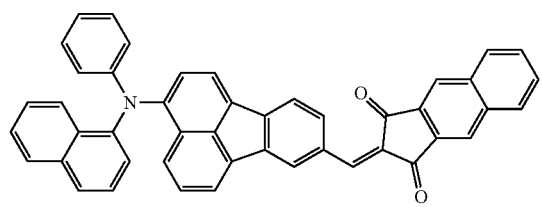
A24
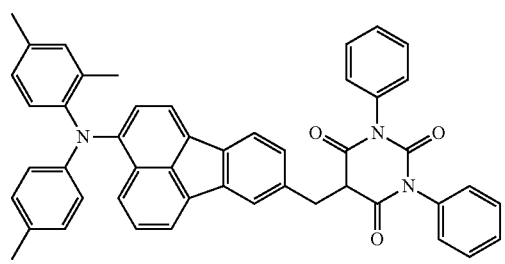
[Group of compounds of formula (2)]
B1
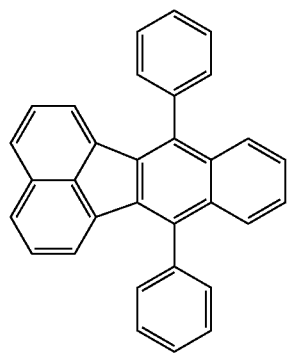
B2
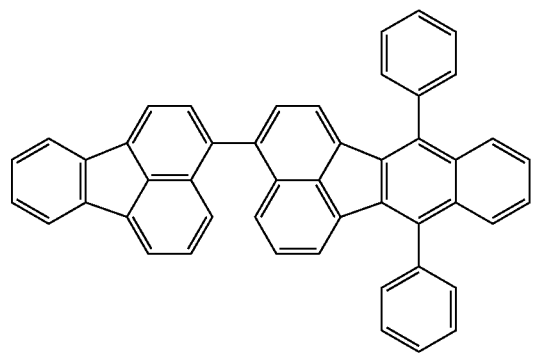

-continued
B3
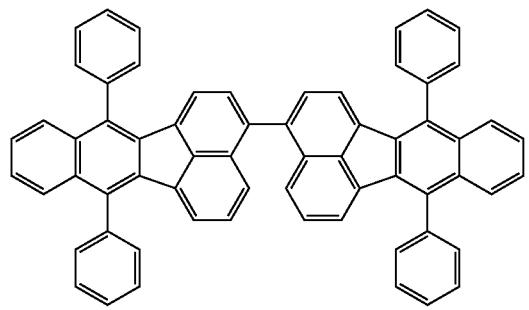
B4
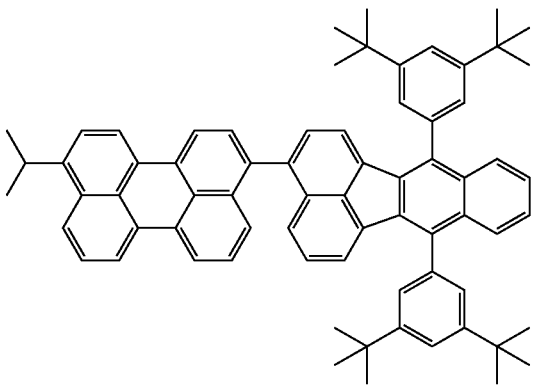
B5
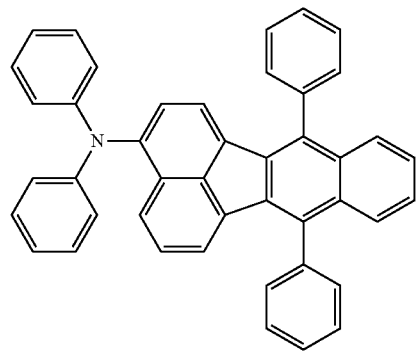
B6
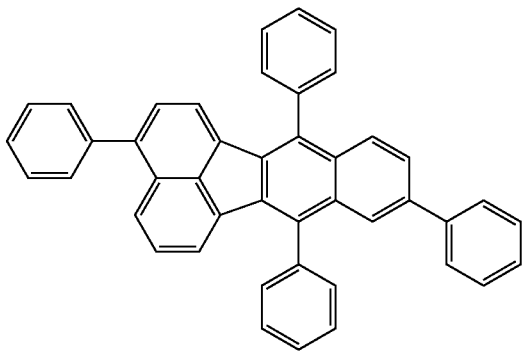
B7
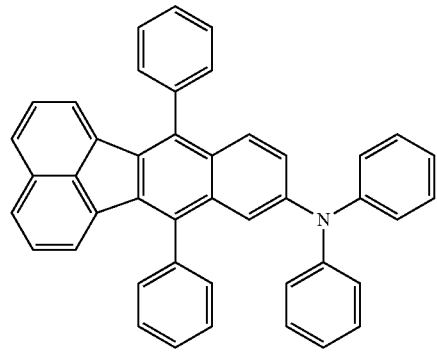
B8
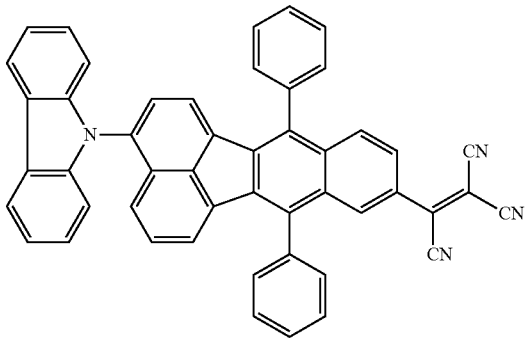
B9
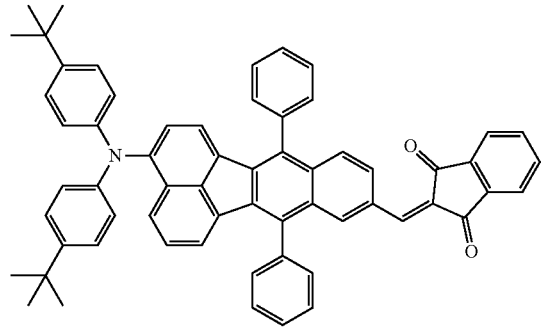
B10
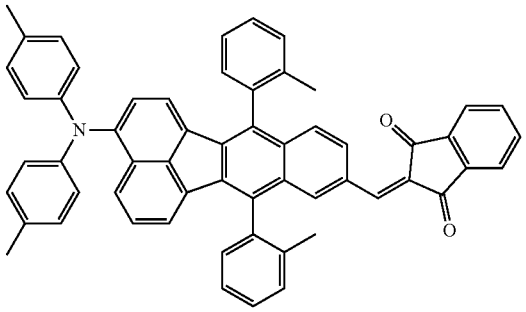

B11
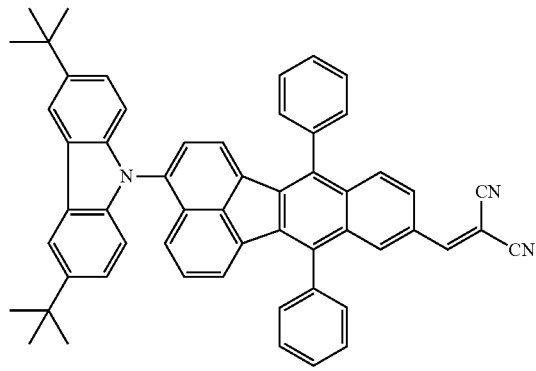
B12
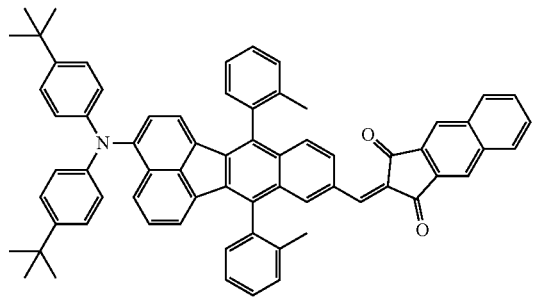
B13
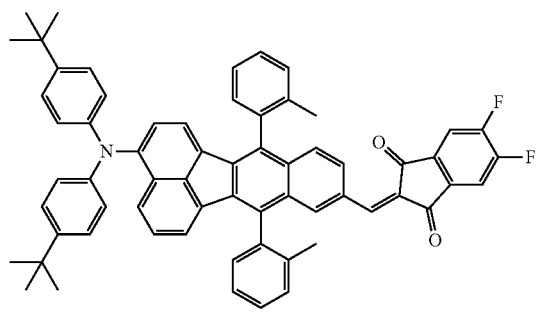
B14
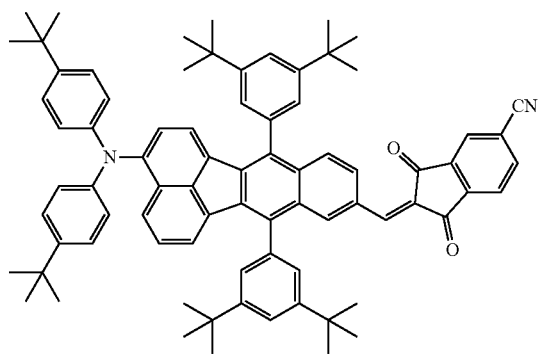
B15
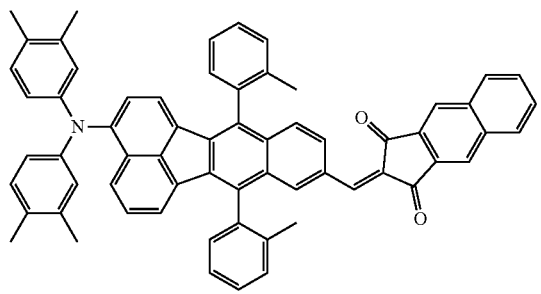
B16
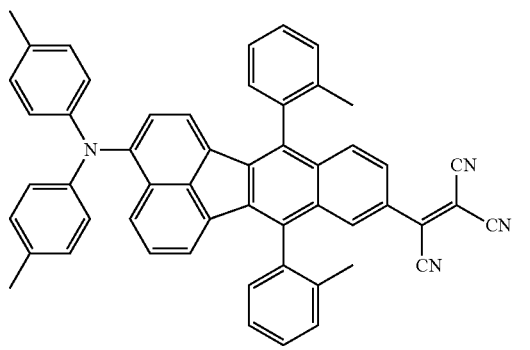
[Group of compounds of formula (3)]
C1
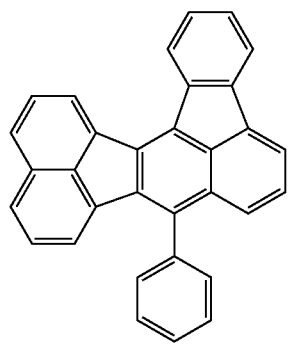
C2
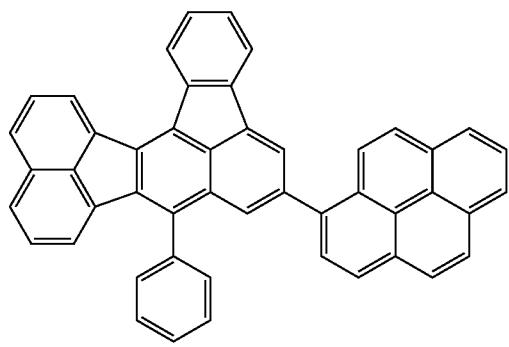

-continued
C3
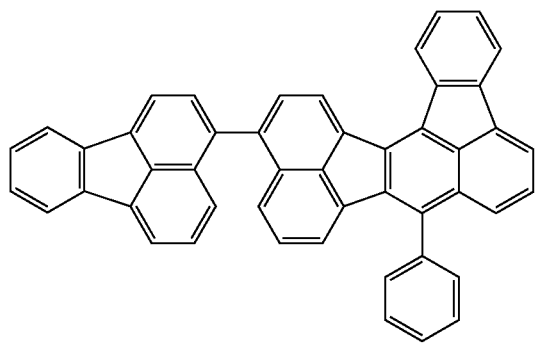
C4
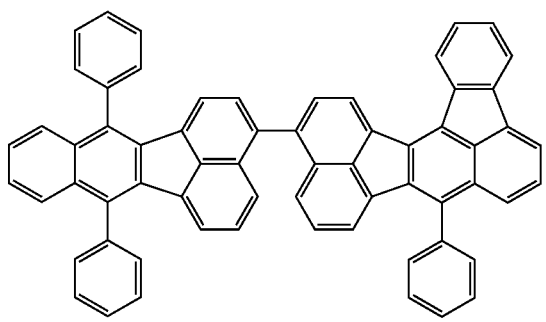
C5
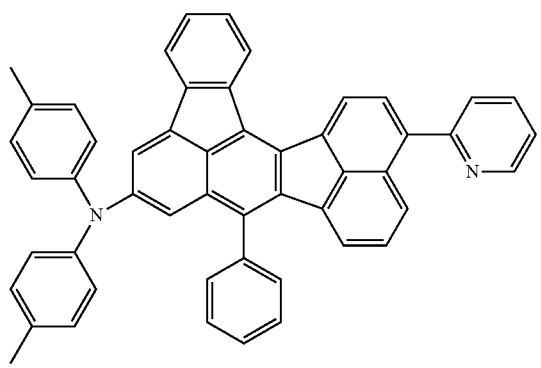
C6
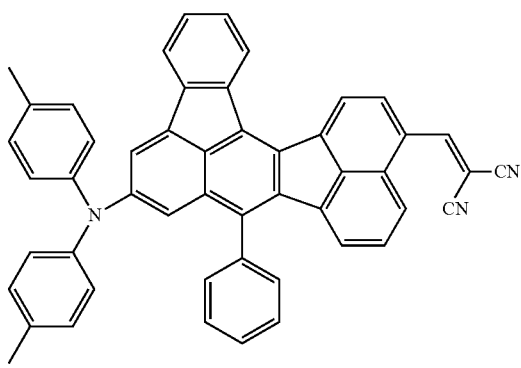
C7
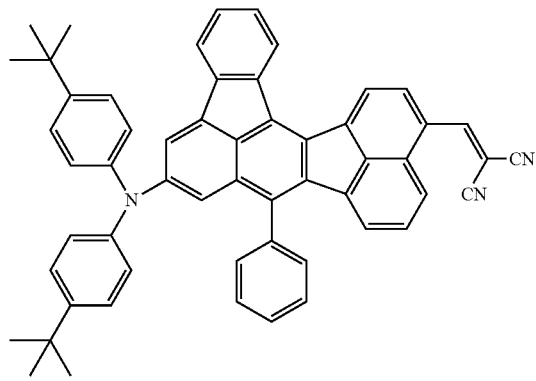
C8
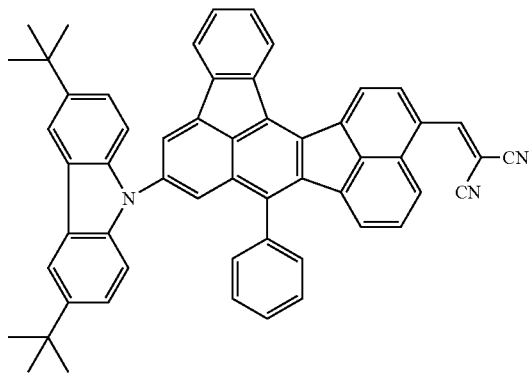
C9
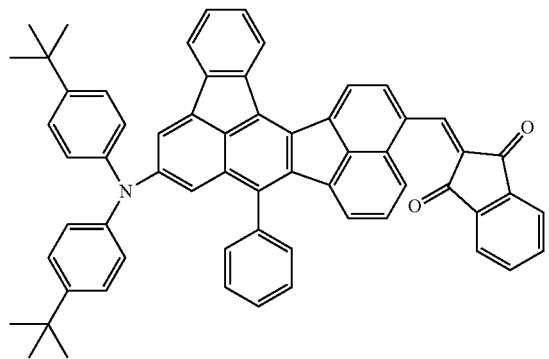
C10
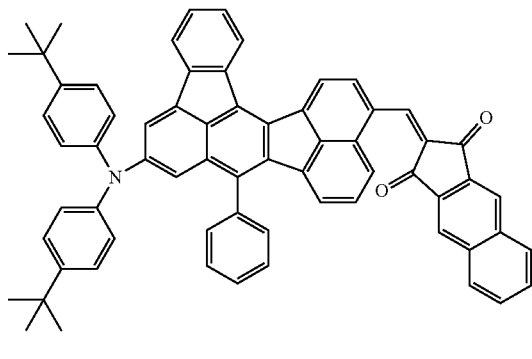

-continued
C11
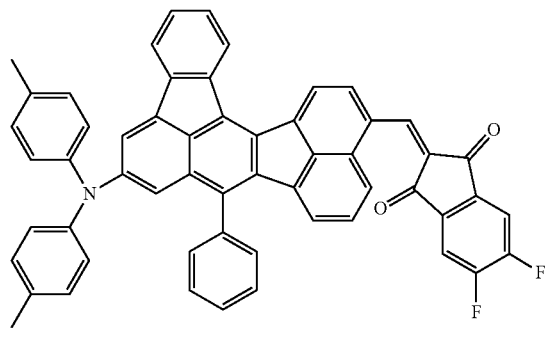
C12
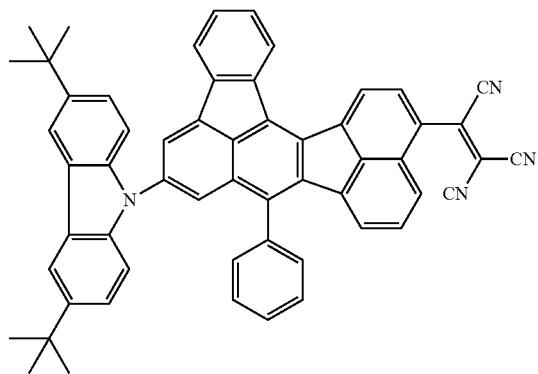
[Group of compounds of formula (4)]
D1
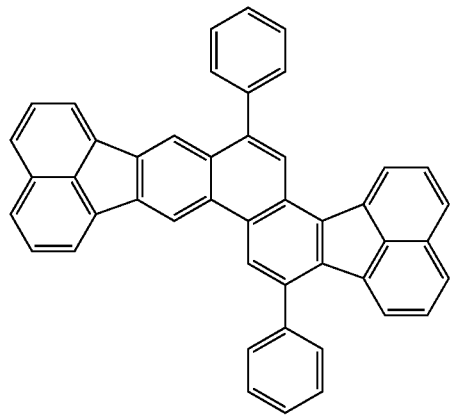
D2
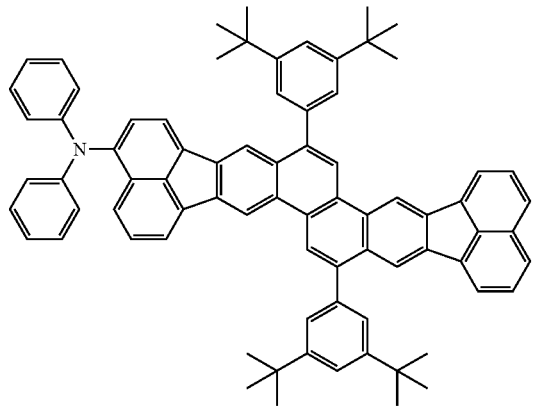
D3
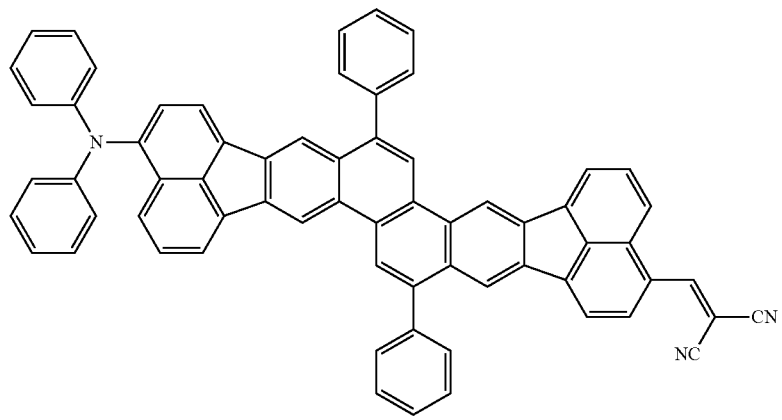

-continued
D4
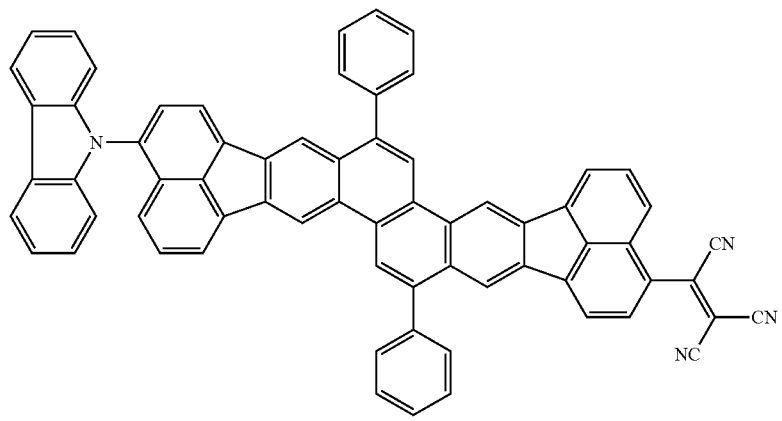
D5
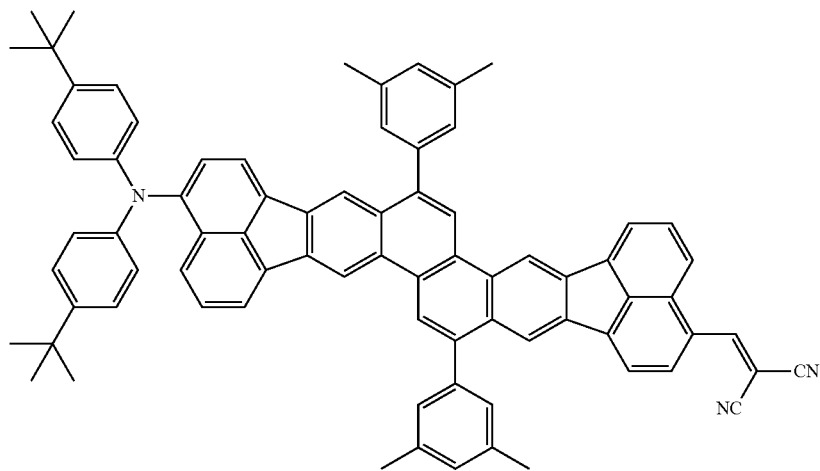
D6
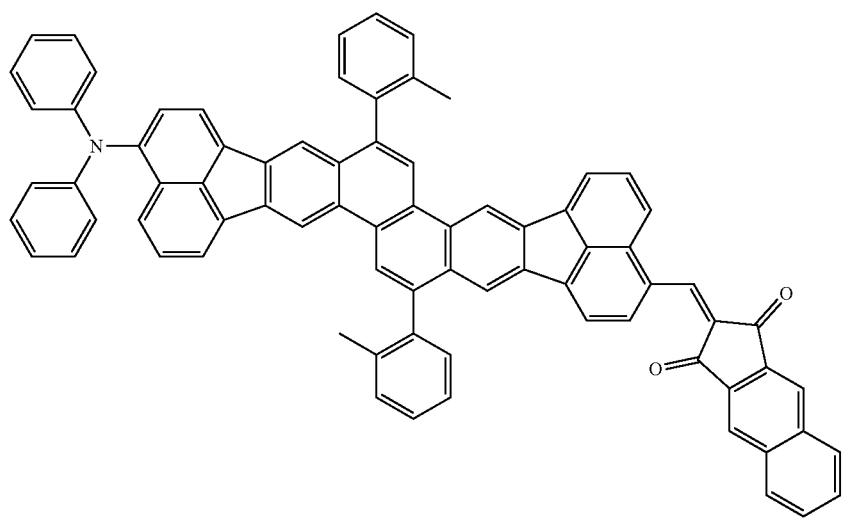

-continued
[Group of compounds of formula (5)]
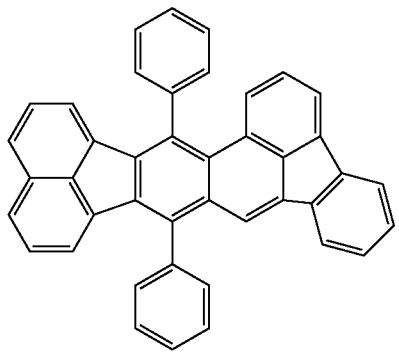
E1
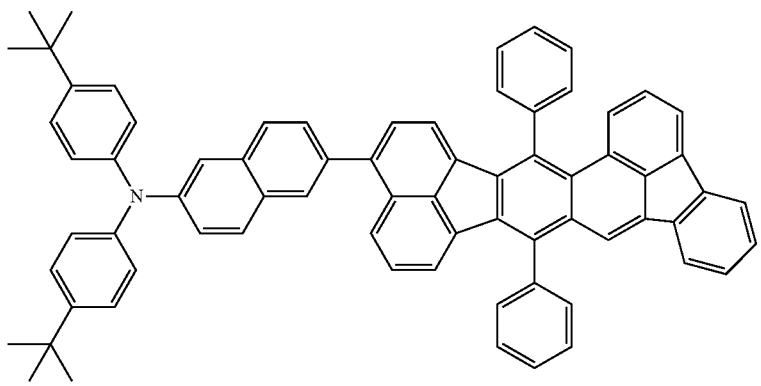
E2
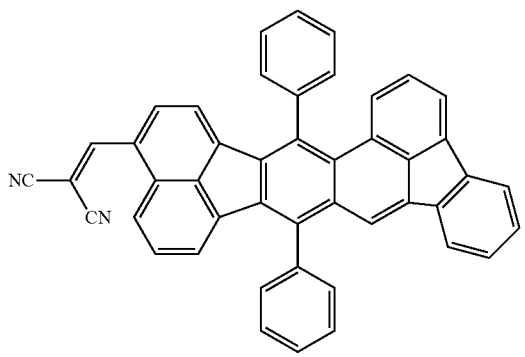
E3
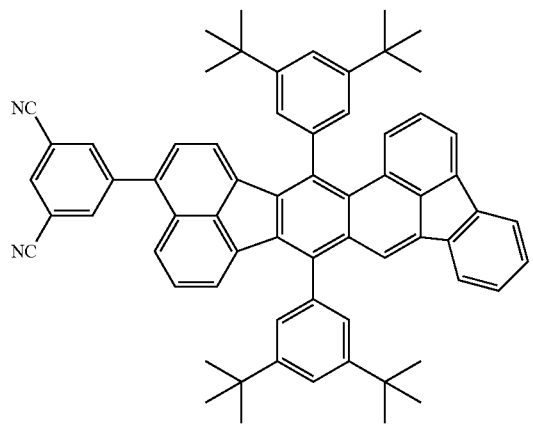
E4
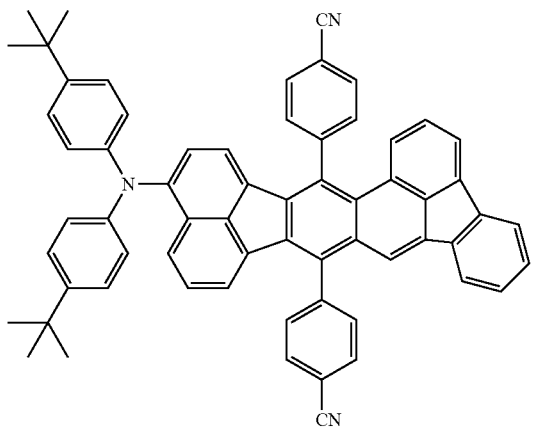
E5
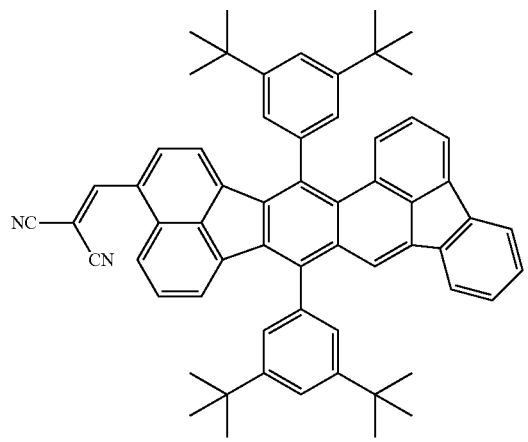
E6

-continued
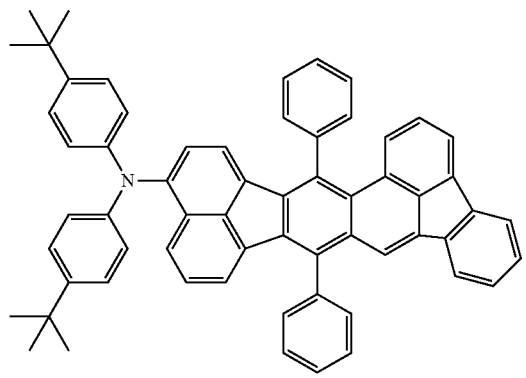
E7
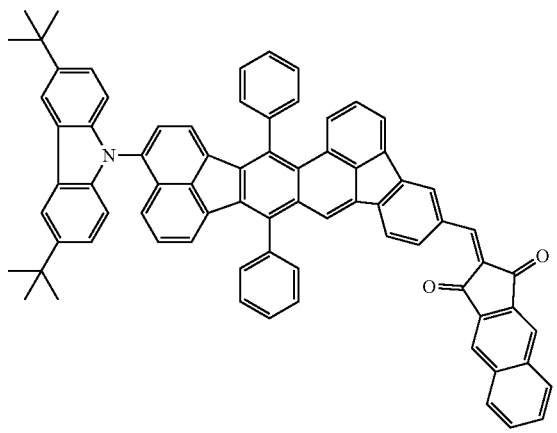
E8
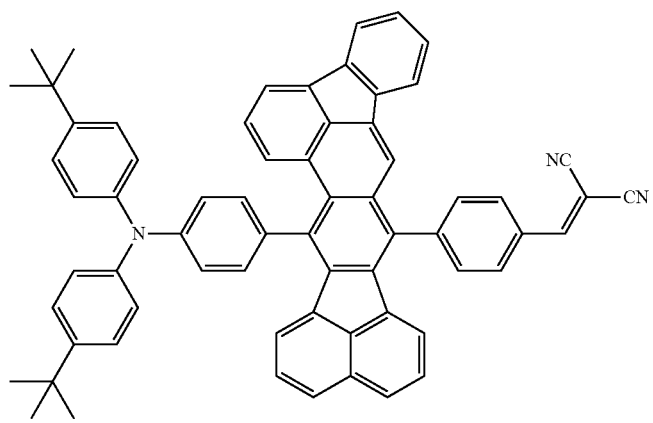
E9
[Group of compounds of formula (6)]
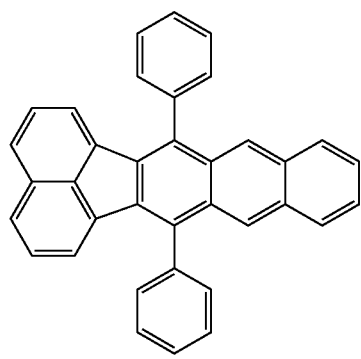
F1
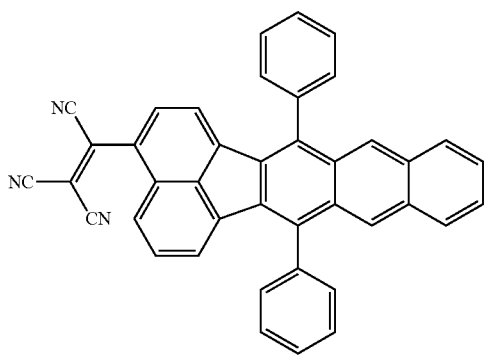
F2
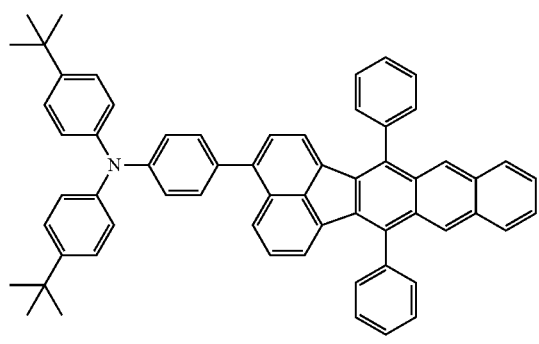
F3
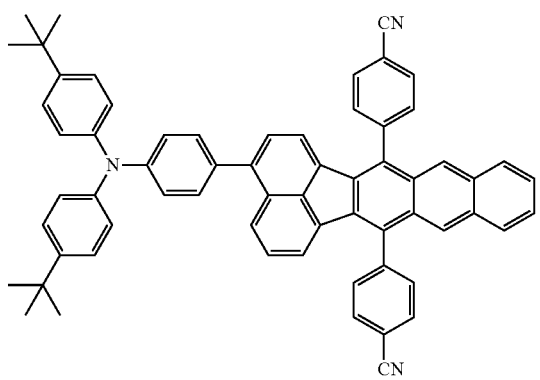
F4

-continued
F5
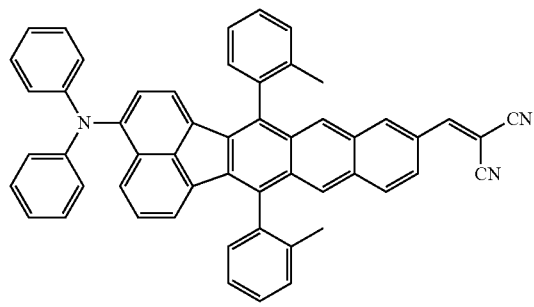
F6
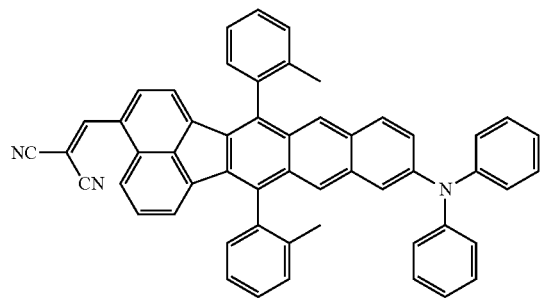
F7
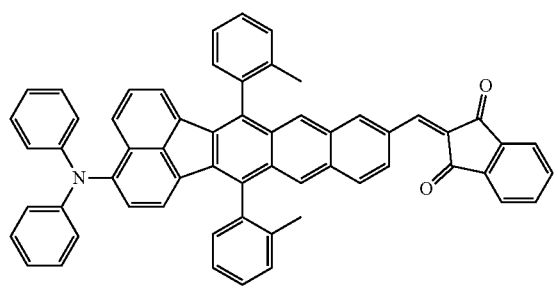
F8
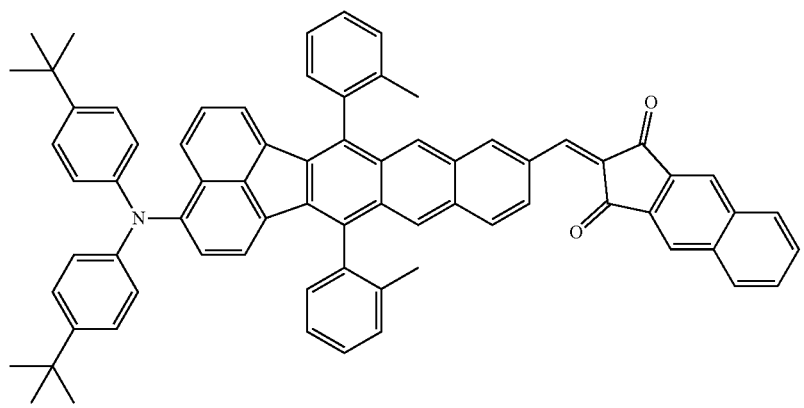
F9
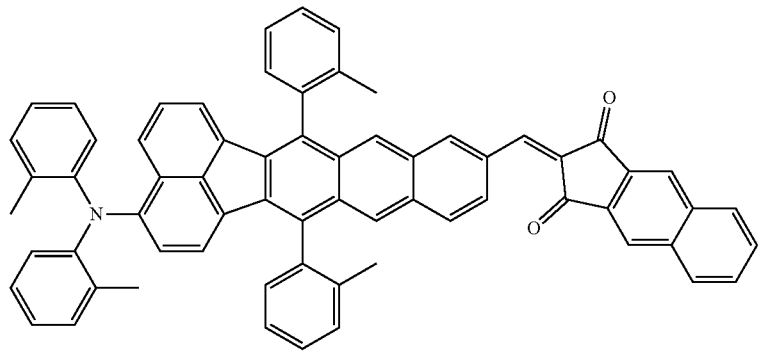

[Group of compounds of formula (7)]
G1
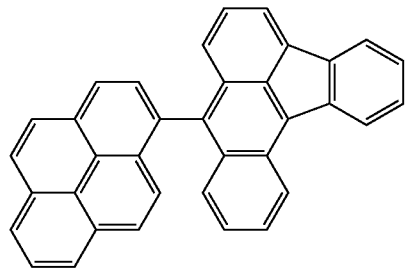
G2
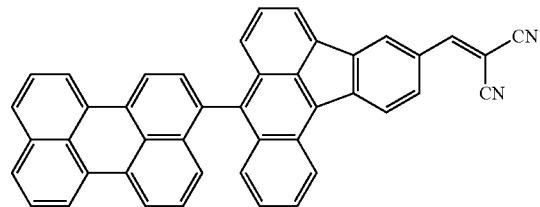
G3
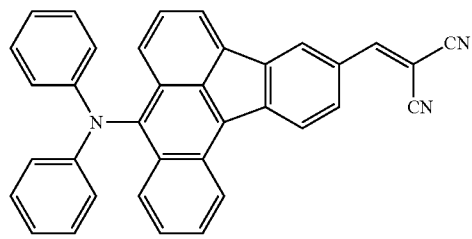
G4
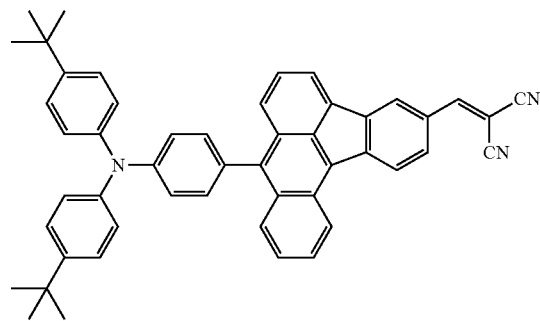
G5
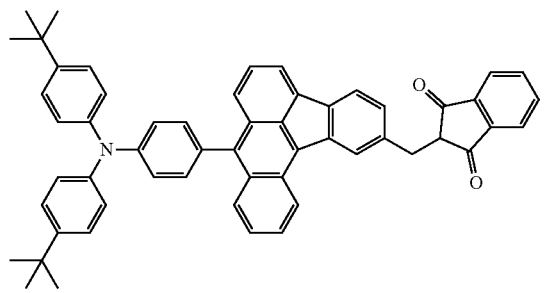
G6
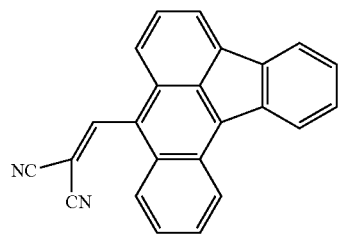
G7
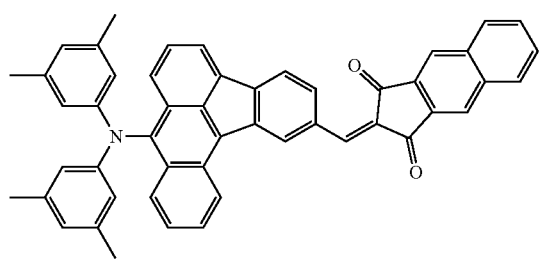
G8
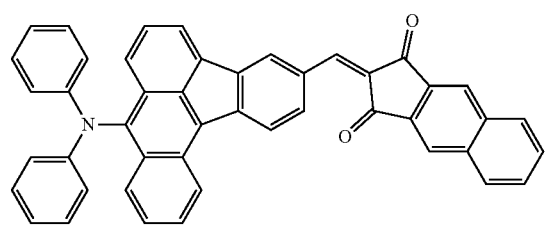

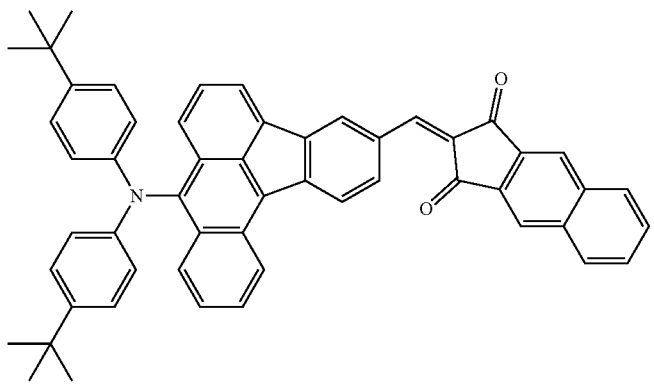
G9
[Group of compounds of formula (8)]
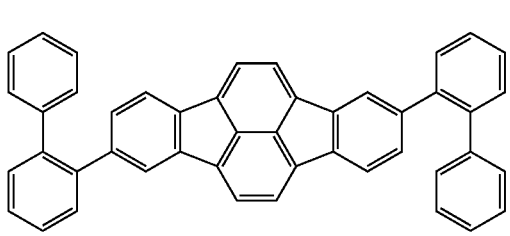
H1
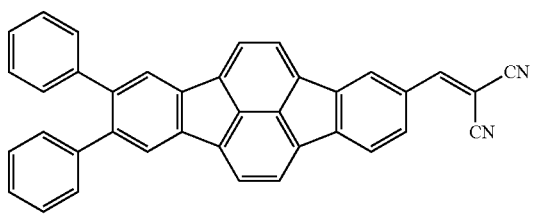
H2
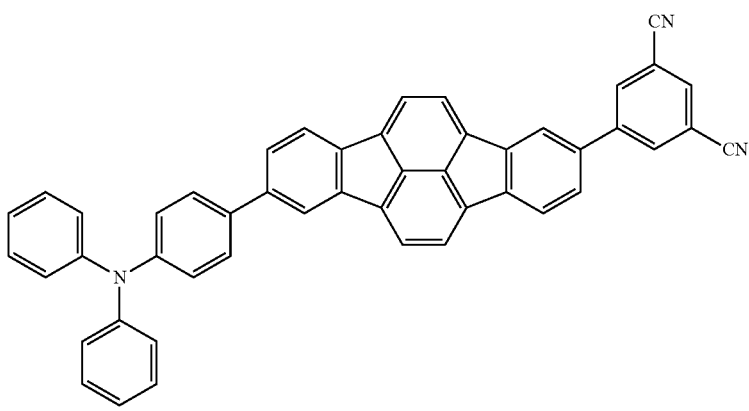
H3
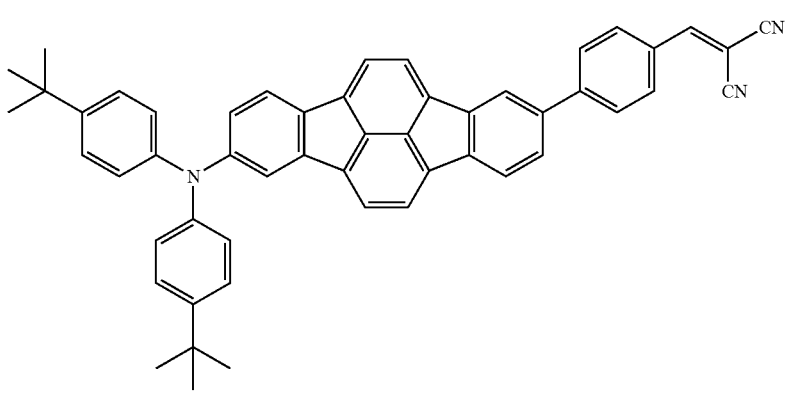
H4

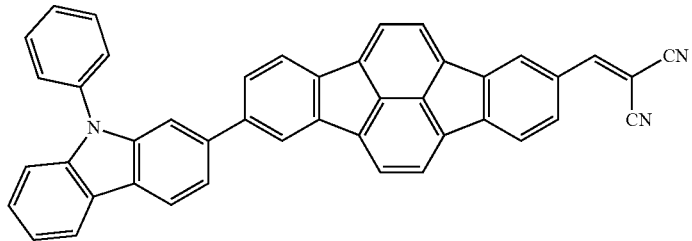
H5
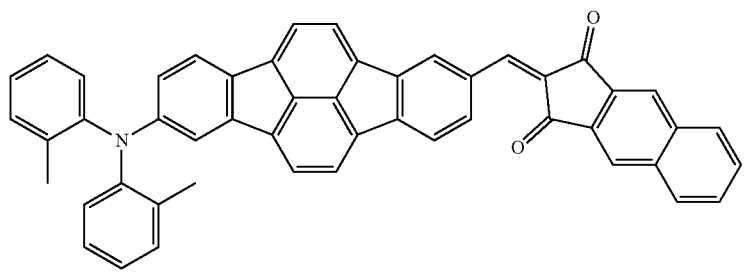
H6
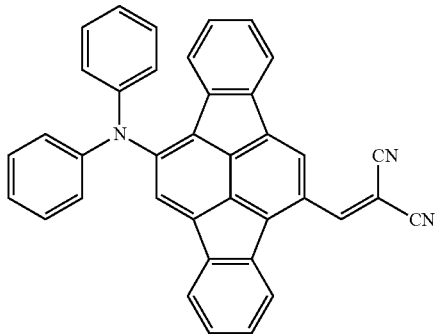
H7
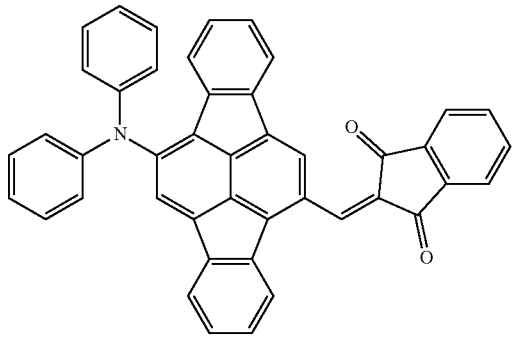
H8
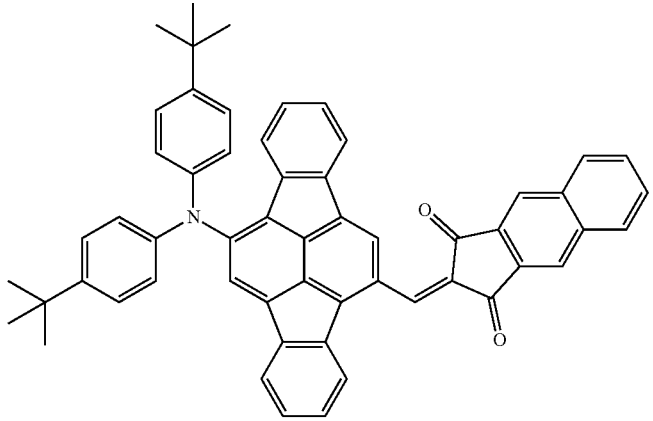
H9

[Group of compounds of formula (9)]
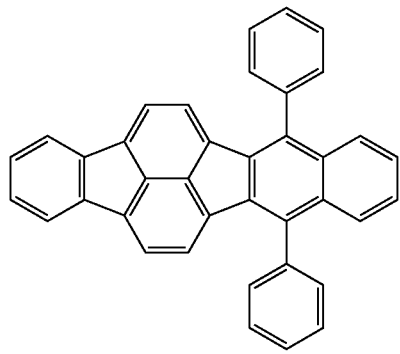 I1
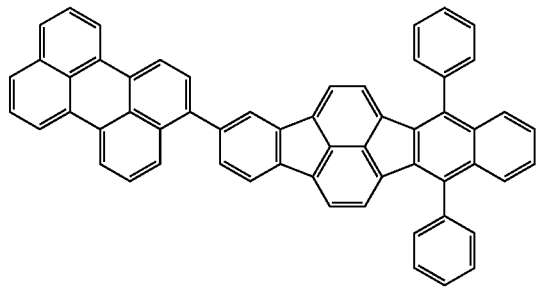 I2
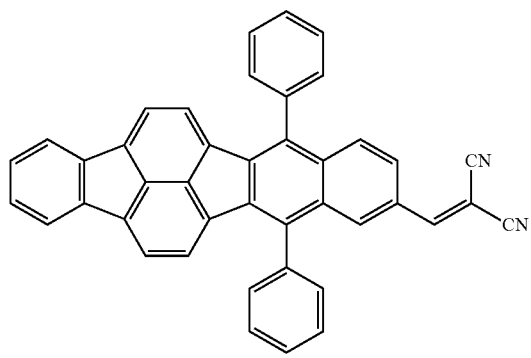 I3
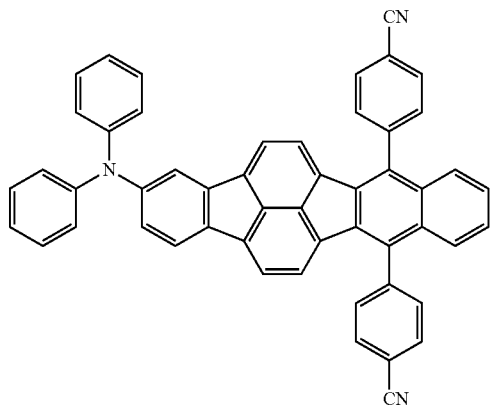 I4
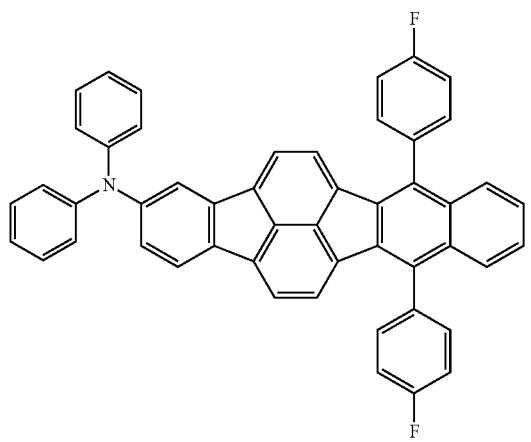 I5
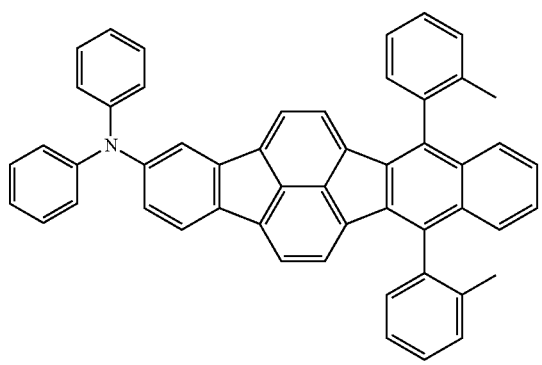 I6

I7
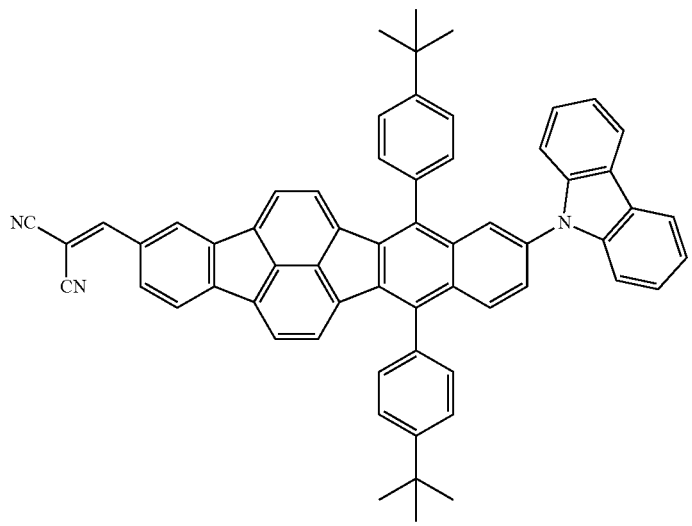
I8
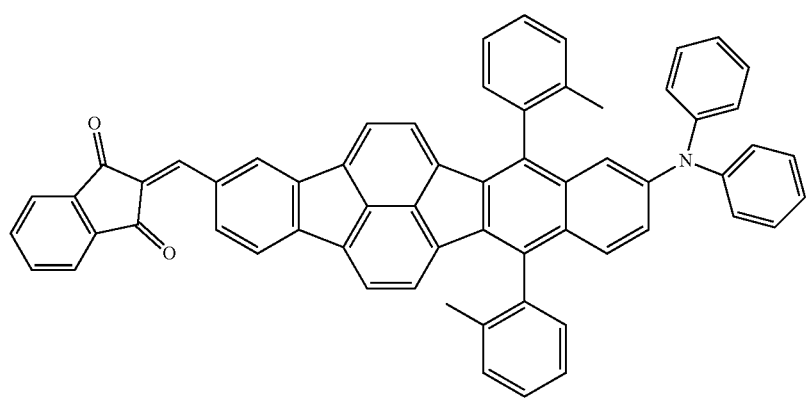
I9
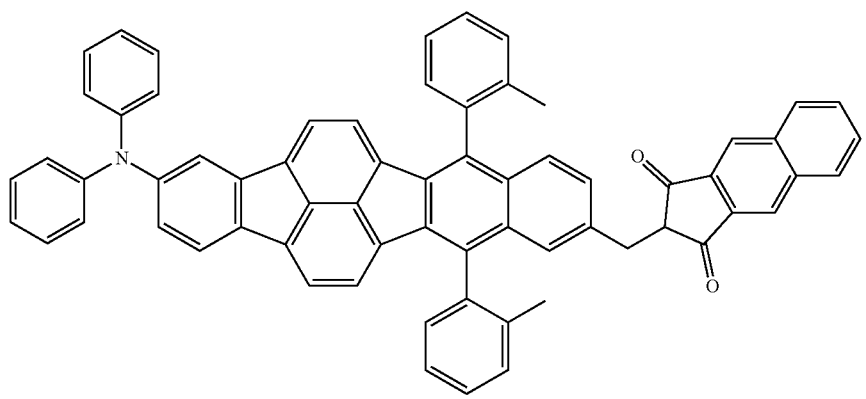

[Group of compounds of formula (10)]
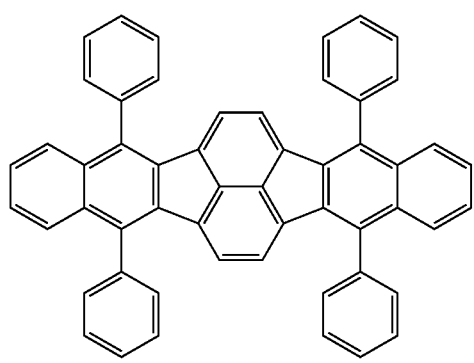 J1
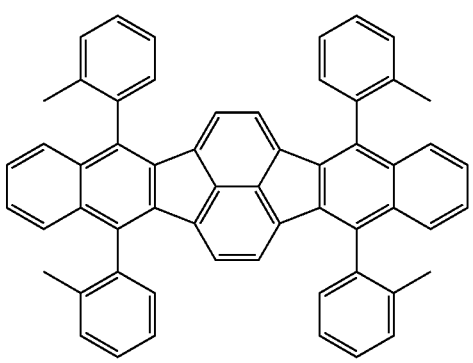 J2
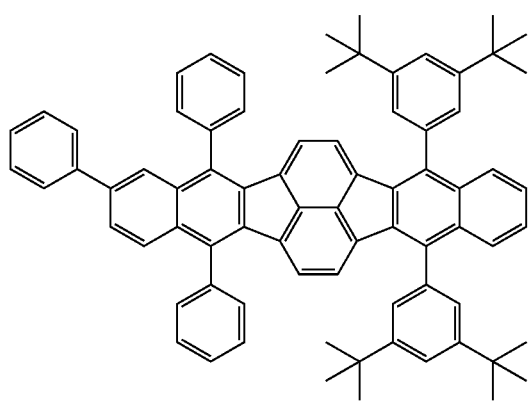 J3
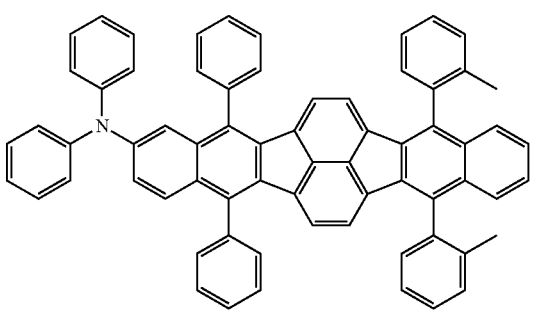 J4
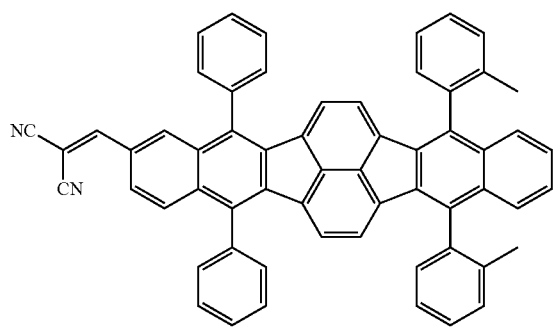 J5
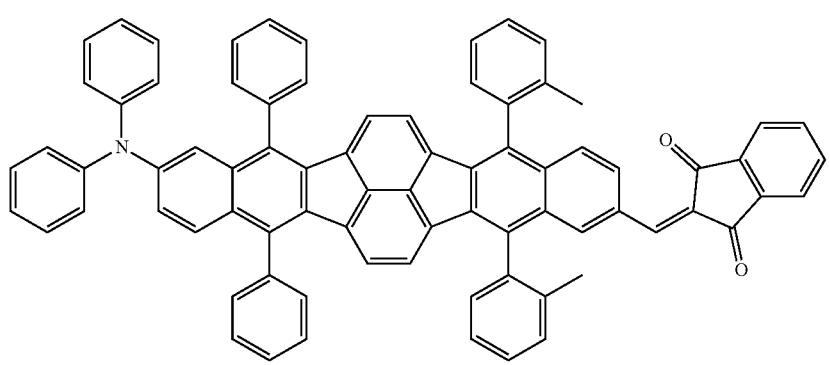 J6

[Group of compounds of formula (11)]
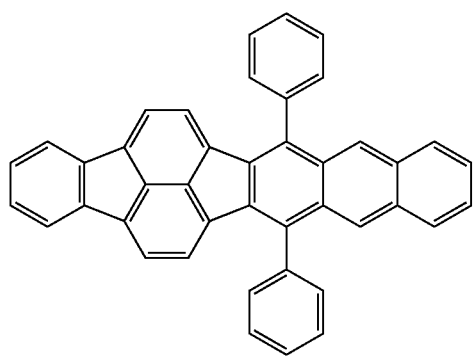
K1
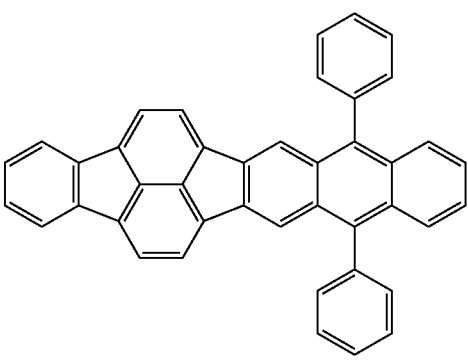
K2
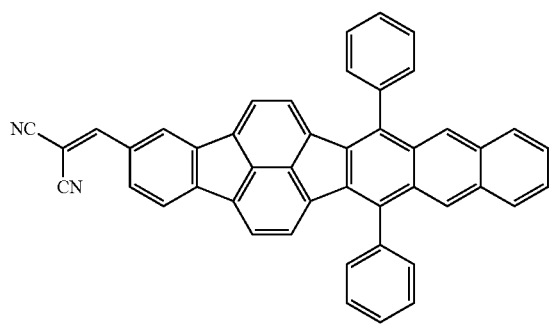
K3
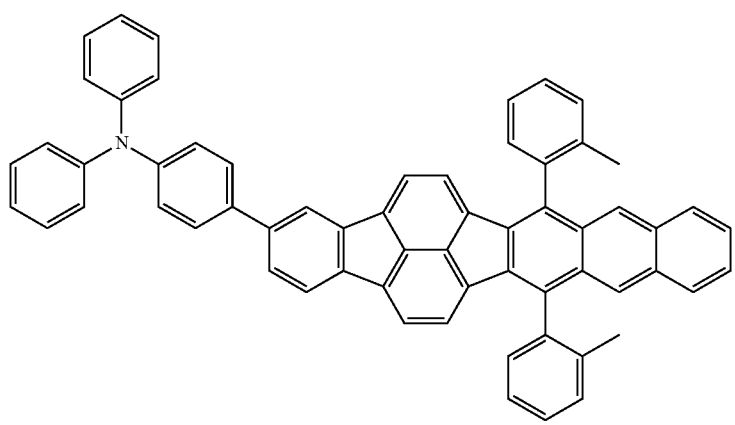
K4
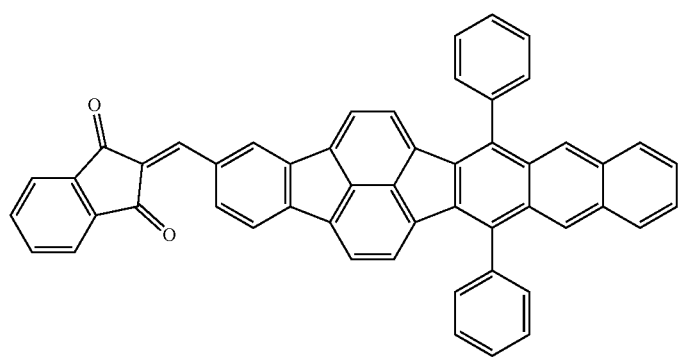
K5

K6
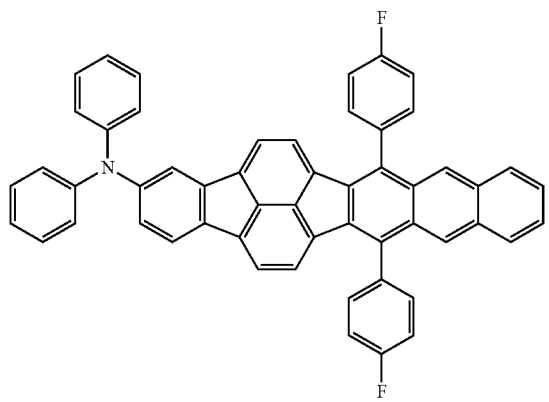
K7
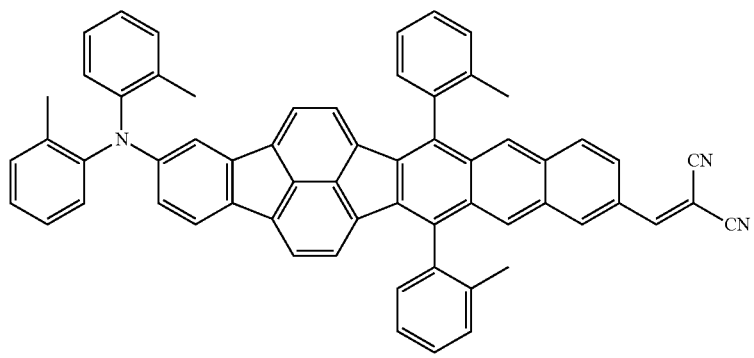
K8
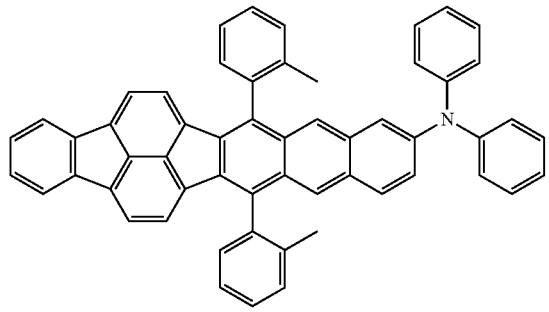
K9
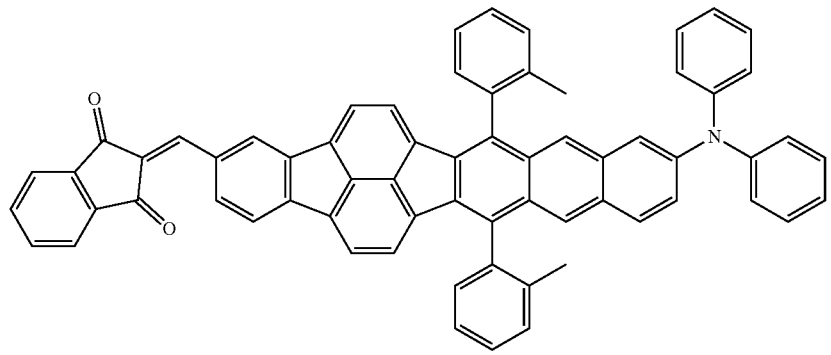

[Group of compounds of formula (12)]
L1
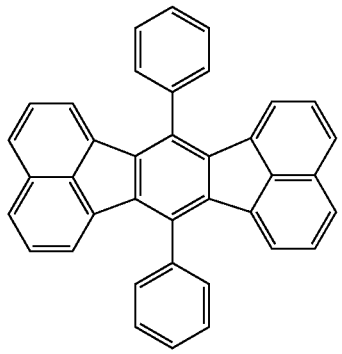
L2
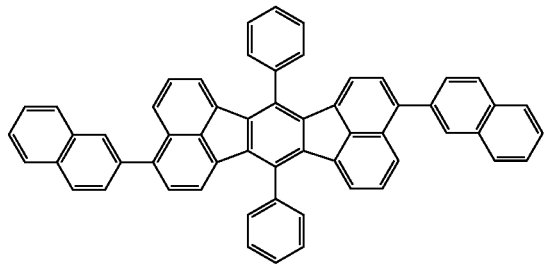
L3
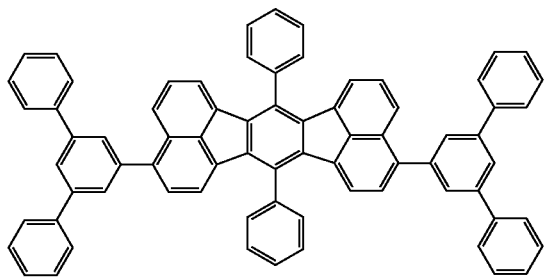
L4
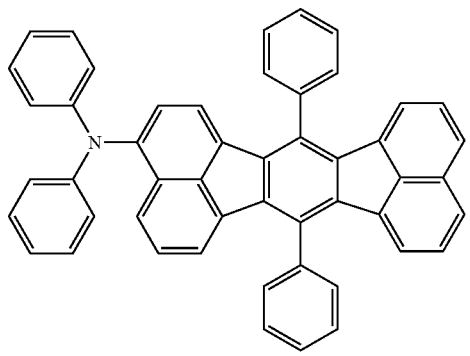
L5
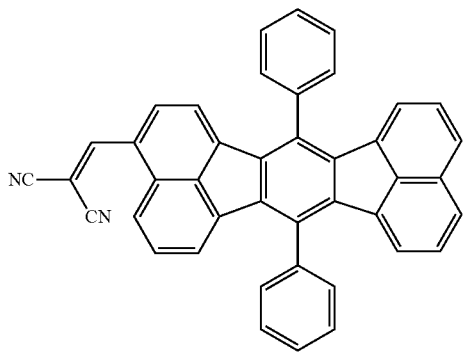
L6
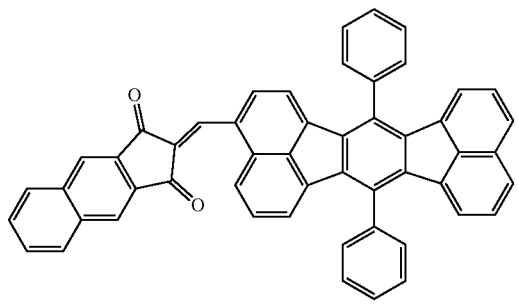
L7
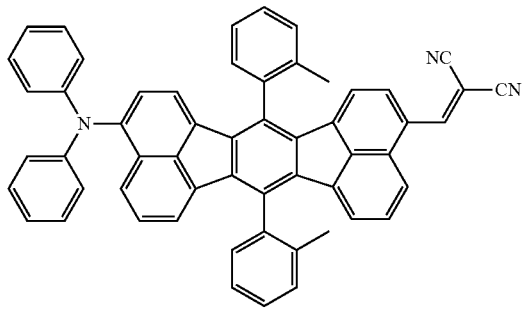
L8
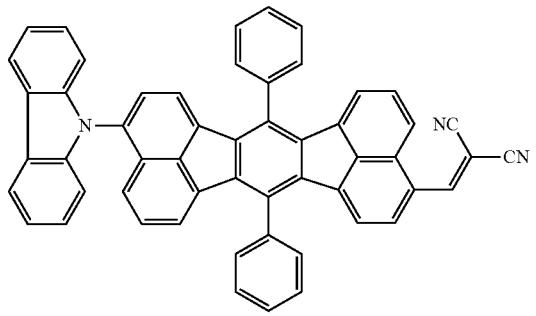

-continued
L9
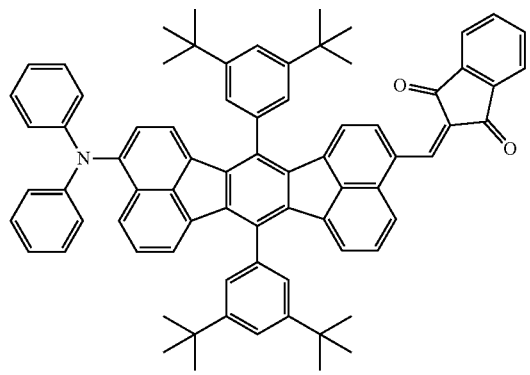
L10
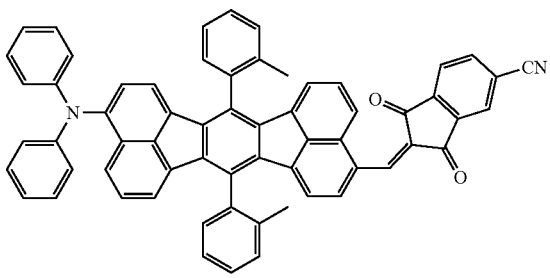
L11
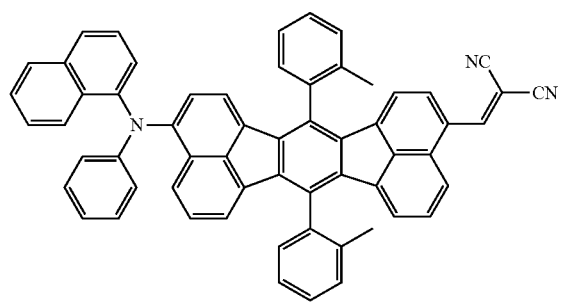
L12
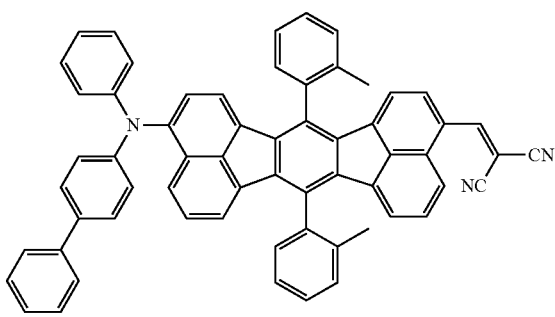
[Group of compounds of formula (13)]
M1
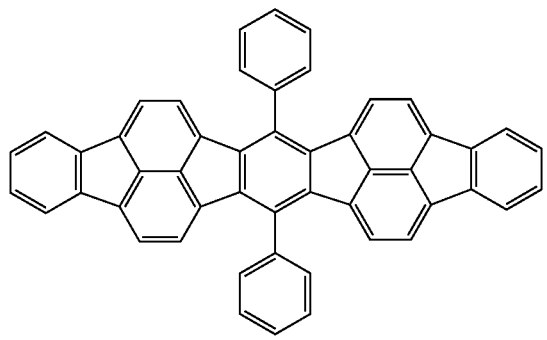
M2
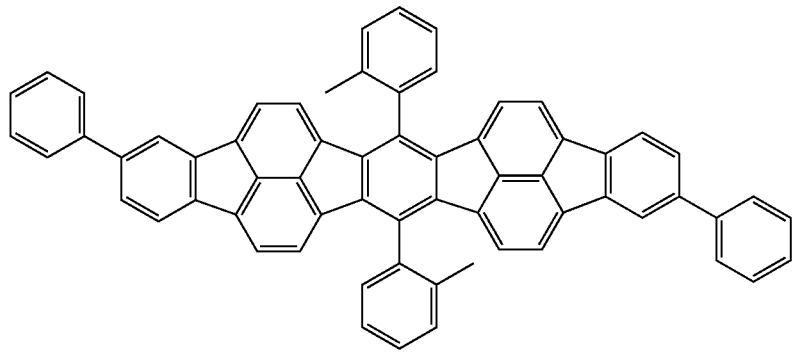

-continued
M3
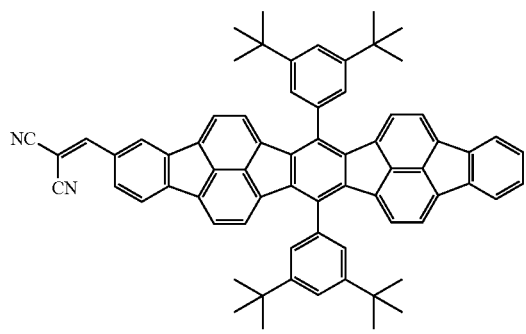
M4
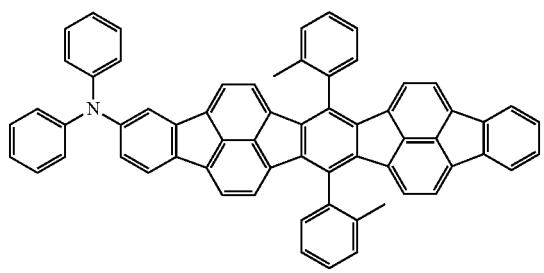
M5
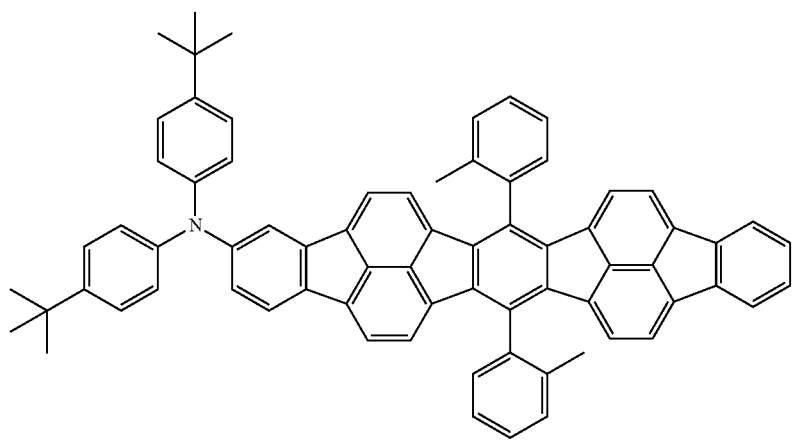
M6
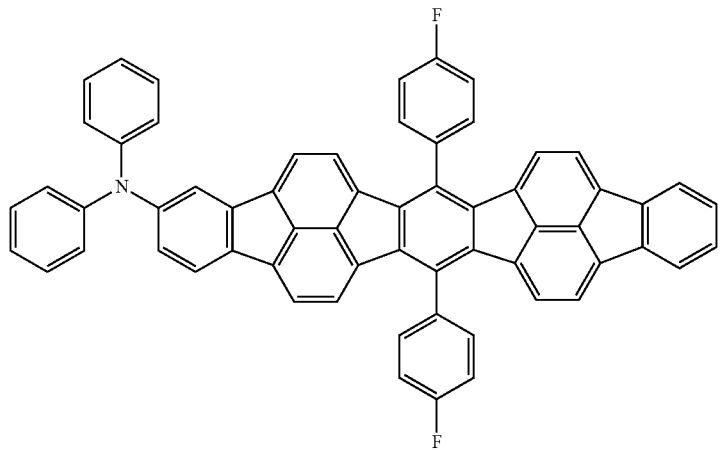
[Group of compounds of formula (14)]
N1
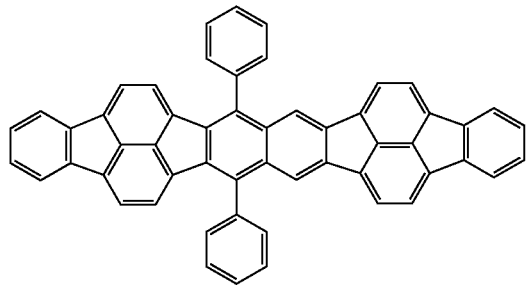
N2
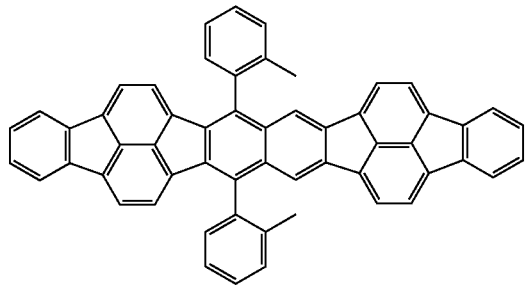

N3
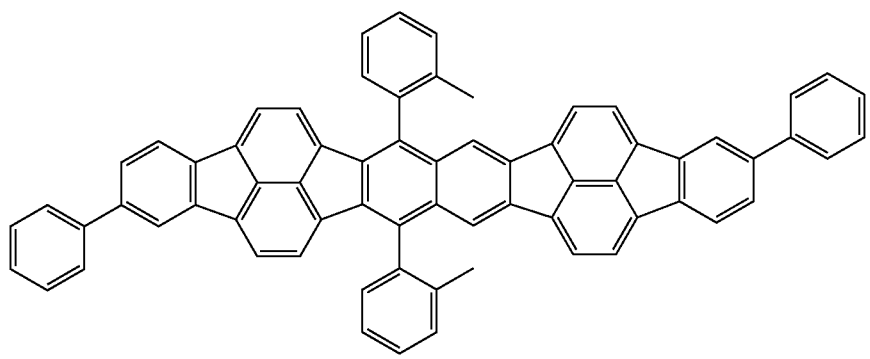
N4
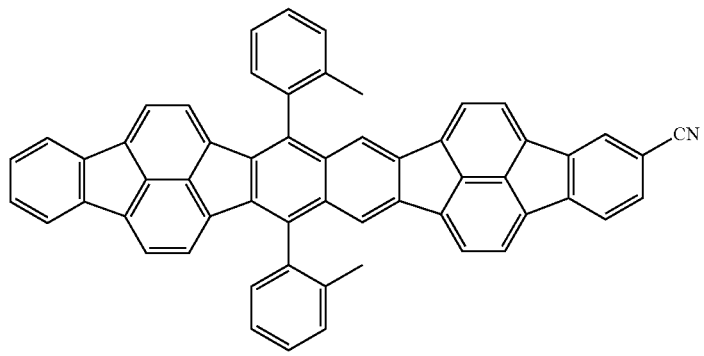
N5
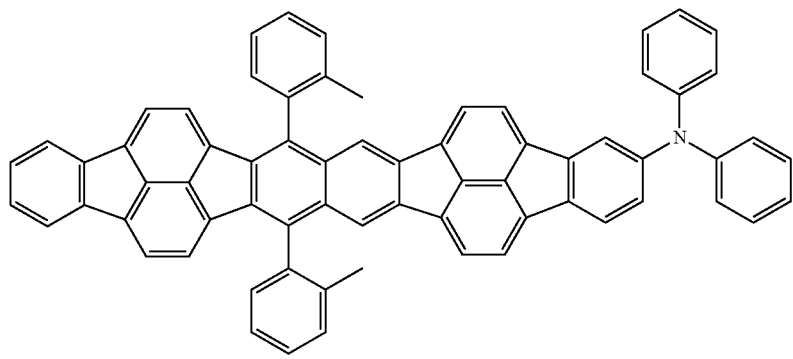
N6
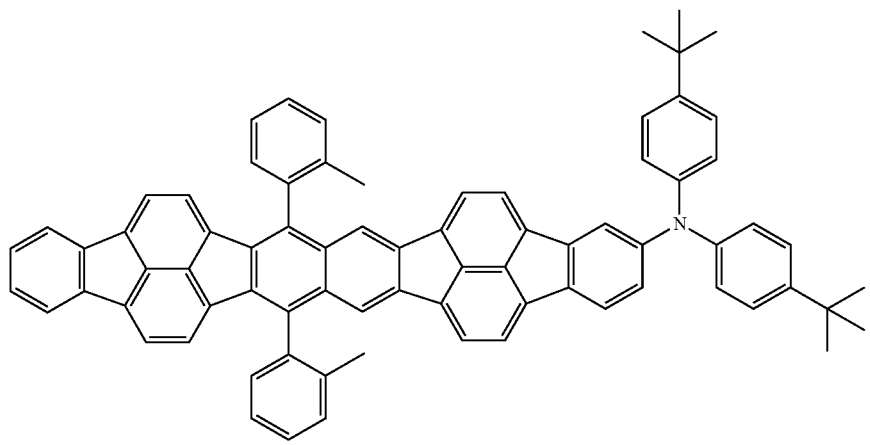

[Group of compounds of formula (15)]
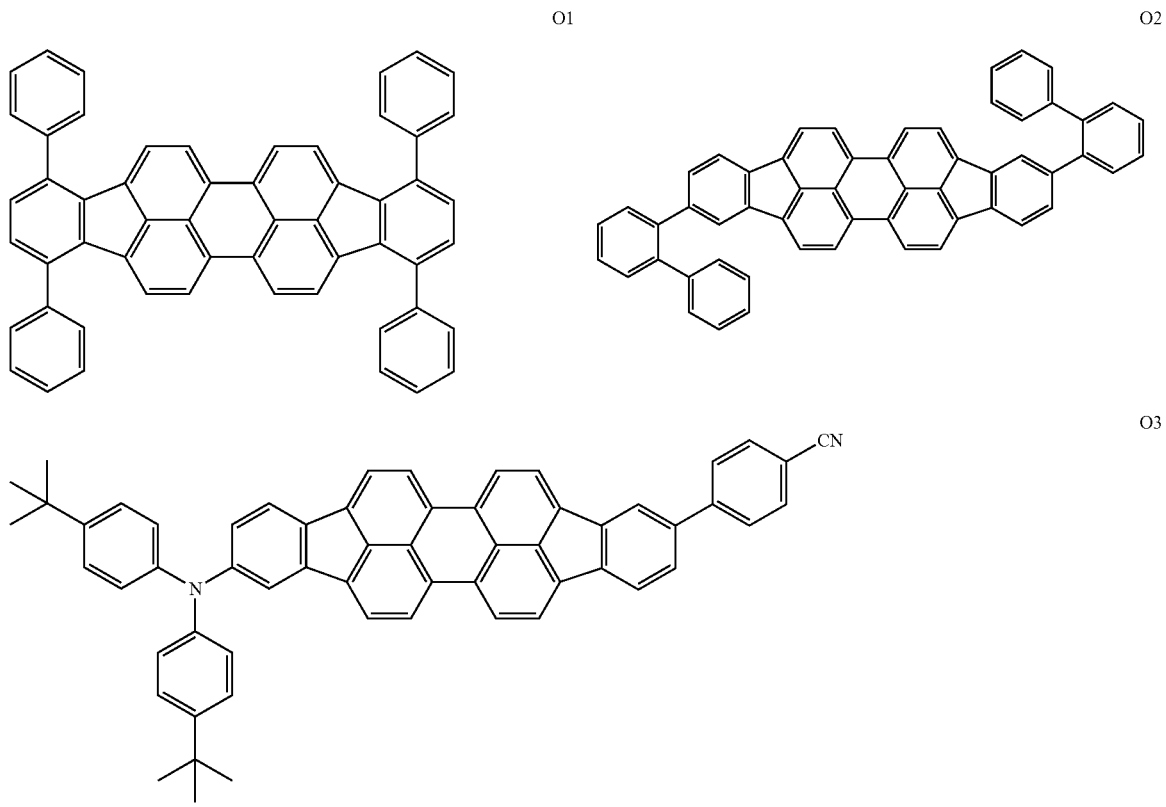
[Group of compounds of formula (16)]
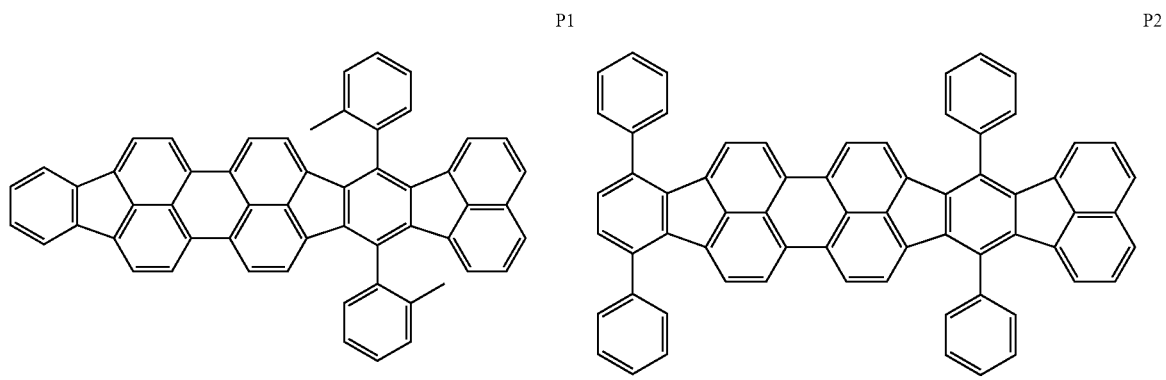
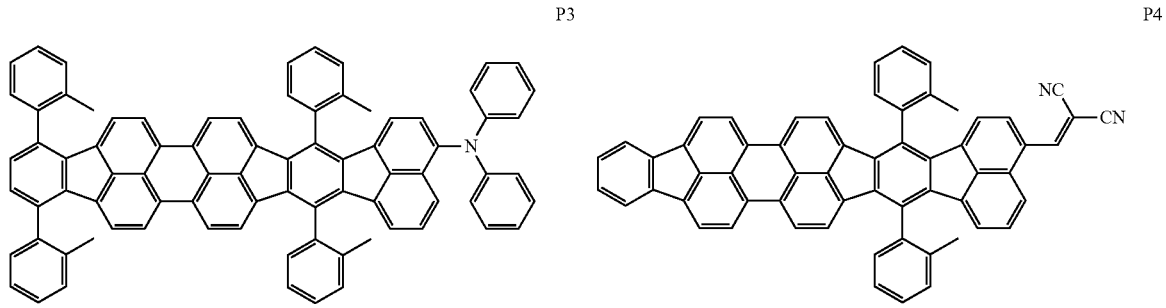

-continued
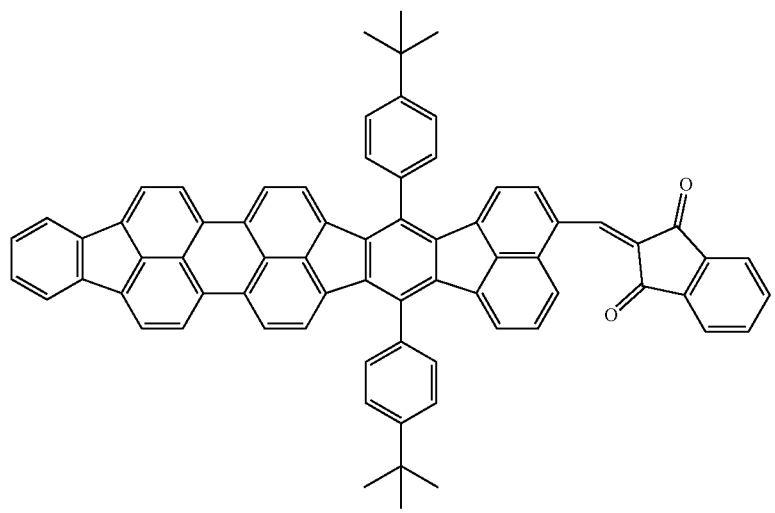
P5
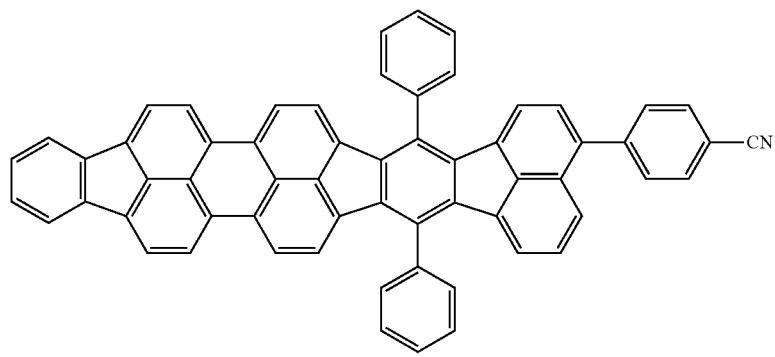
P6
[Group of compounds of formula (17)]
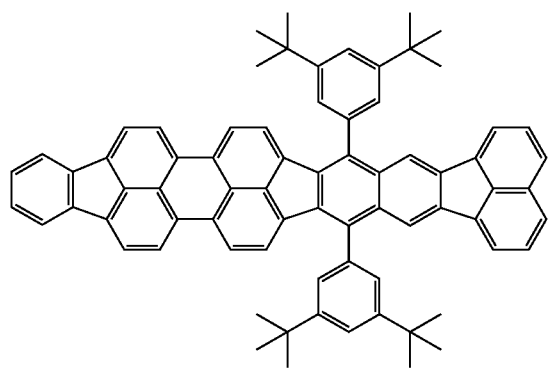
Q1
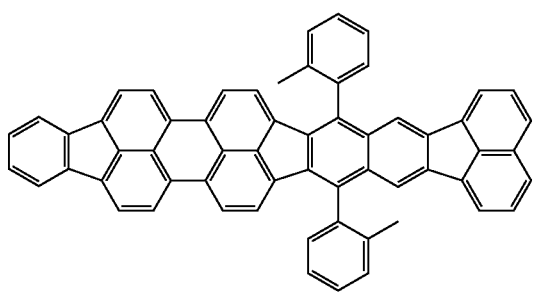
Q2

Q3

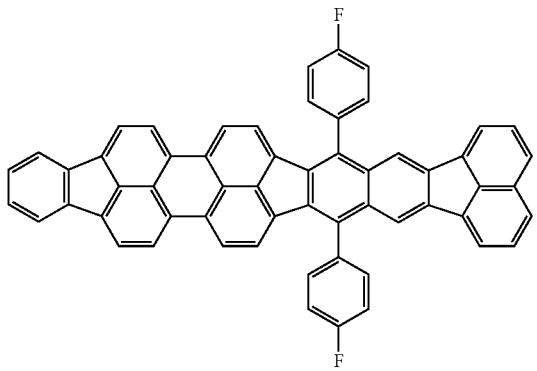

Q4

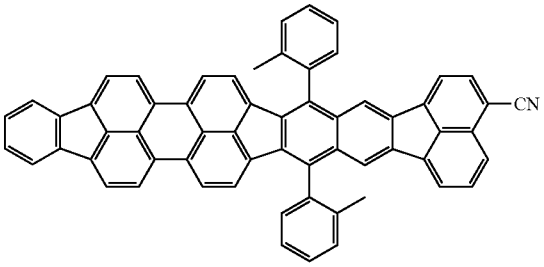

Q5

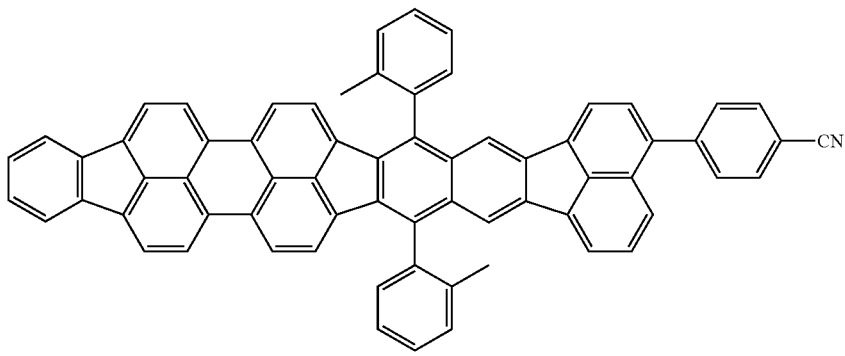

Q6

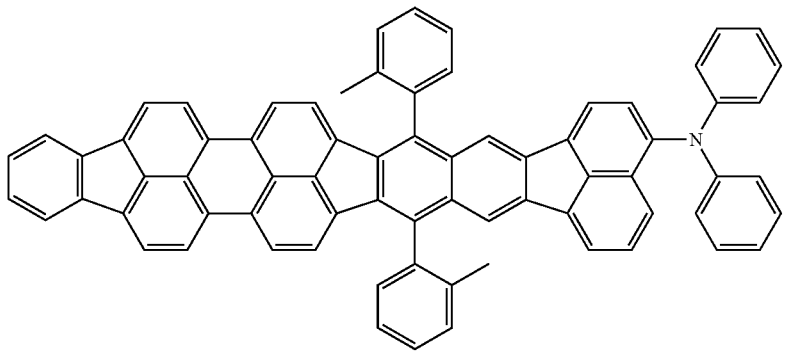

The compounds shown above have the fluoranthene skeleton in the same way as in the fullerene. Therefore, in these organic compounds, when molecules absorb light with a specific wavelength and become excited, excitation energy of the molecules can be transferred to the first compound. Here, since the compound defined by any one of general formulas (1) to (6) has a basic skeleton which absorbs the blue wavelength, the compound is suitable as a constituent material of an organic photoelectric conversion element having sensitivity to blue to green light. Furthermore, regarding the compound defined by any one of general formulas (1) to (6), by increasing the conjugation length of the compound by introducing a substituent, such as an aryl group or vinyl group, the compound can be used as a constituent material of an organic photoelectric conversion element having sensitivity to green to red or infrared light. Furthermore, since the compound defined by any one of general formulas (7) to (12) has a basic skeleton which absorbs the blue-green to yellow wavelengths, the compound is suitable as a constituent material of an organic photoelectric conversion element having sensitivity to green to yellow light. Furthermore, regarding the compound defined by any one of general formulas (7) to (12), by increasing the conjugation length of the compound by introducing a substituent, such as an aryl group or vinyl group, the compound can be used as a constituent material of an organic photoelectric conversion element having sensitivity to green to red or infrared light. On the other hand, since the compound defined by any one of general formulas (13) to (17) has a basic skeleton which absorbs the red wavelength, the compound can be used as a constituent material of an organic photoelectric conversion element having sensitivity to red light. Furthermore, by increasing the conjugation length of the compound by introducing a substituent, such as an aryl group or vinyl group, the compound can be used as a constituent material of an organic photoelectric conversion element having sensitivity to red or infrared light.

(2e) Second Organic Compound Layer

In the organic photoelectric conversion element of the present invention, as the constituent material of the second organic compound layer 11, an organic compound that can be used as a hole transport material or hole injection material may be used.

(2f) Third Organic Compound Layer

In the organic photoelectric conversion element of the present invention, as the constituent material of the third organic compound layer 12, a material having a high ionization potential, specifically, an organic compound that can be used as an electron transport material or electron injection material may be used. Furthermore, the first compound having a fullerene skeleton, which is one of the constituent materials of the first organic compound layer 10, is a material having an excellent electron transport property as described above, and therefore, the first compound can be used as a constituent material of the third organic compound layer 12.

3. Use of Organic Photoelectric Conversion Element of the Present Invention

Regarding the organic photoelectric conversion element of the present invention, by appropriately setting the constituent material of the first organic compound layer, it is possible to produce organic photoelectric conversion elements which respond to light with different wavelengths. Here, the term "wavelength" refers to the wavelength of light received by a predetermined organic photoelectric conversion element. In the case where a plurality of types of organic photoelectric conversion elements which respond to different wavelengths are used, when the plurality of types of organic photoelectric conversion elements are stacked in a direction from the hole-collecting electrode toward the electron-collecting electrode, it is possible to obtain an organic photoelectric conversion apparatus which does not require the color filter shown in FIGURE. Among the plurality of types of organic photoelectric conversion elements included in the organic photoelectric conversion apparatus, at least one type of organic photoelectric conversion element is the organic photoelectric conversion element according to the present invention.

The organic photoelectric conversion element according to the present invention can be used as a constituent member of an optical area sensor by two-dimensionally arranging the organic photoelectric conversion elements in the in-plane direction. An optical area sensor includes a plurality of organic photoelectric conversion elements, and the plurality of organic photoelectric conversion elements are arranged in the row and column directions. Note that the organic photoelectric conversion elements included in the optical area sensor may be replaced with the organic photoelectric conversion apparatuses.

The organic photoelectric conversion element according to the present invention can be used as a constituent member of an image pickup device. An image pickup device includes a plurality of organic photoelectric conversion elements that serve as light receiving pixels, and a transistor connected to each of the organic photoelectric conversion elements. Note that, the term "transistor" refers to a transistor that reads out charges generated in the organic photoelectric conversion element. The information based on the charges read out by the transistor is transferred to a sensor unit which is connected to the image pickup device. As the sensor unit, for example, a CMOS sensor, a CCD sensor, or like may be used. The information obtained by each light receiving pixel is gathered by the sensor unit, and thereby, an image can be obtained.

The image pickup device may include an optical filter, such as a color filter, disposed so as to correspond to each of the light receiving pixels. In the case where an organic photoelectric conversion element responds to light having a specific wavelength, it is desirable to provide a color filter that transmits light in the wavelength range to which the organic photoelectric conversion element can respond. One color filter may be provided for each light receiving pixel, or one color filter may be provided for a plurality of light receiving pixels.

The optical filter included in the image pickup device is not limited to the color filter, and in addition, a low-pass filter that transmits wavelengths equal to or higher than infrared, a UV-cut filter that transmits wavelengths equal to or lower than ultraviolet, a long pass filter, or the like can be used.

The image pickup device may include an optical member, such as a microlens, for example, disposed so as to correspond to each of the light receiving pixels. The microlens included in the image pickup device is a lens that condenses light from the outside on the photoelectric conversion portion constituting the organic photoelectric conversion element in the image pickup device. One microlens may be provided for each light receiving pixel, or one microlens may be provided for a plurality of light receiving pixels. In the case where a plurality of light receiving pixels are provided, it is desirable that one microlens be provided for a predetermined number, two or more, of light receiving pixels.

The organic photoelectric conversion element according to the present invention can be used in an image pickup apparatus. An image pickup apparatus includes an image pickup optical system having a plurality of lenses, and an image pickup device which receives light that has passed through the image pickup optical system. Furthermore, an image pickup apparatus may include a joint portion that can be connected to an image pickup optical system, and an image pickup device. The term "image pickup apparatus" more specifically refers to a digital camera or digital still camera.

The image pickup apparatus may further include a receiving unit configured to receive a signal from the outside. The signal received by the receiving unit is a signal that controls at least one of the image pickup range, image pickup start, and image pickup end of the image pickup apparatus. The image pickup apparatus may further include a transmitting unit configured to transmit an image obtained by image pickup to the outside. In such a manner, by including the receiving unit and the transmitting unit, the image pickup apparatus can be used as a network camera.

EXAMPLES

The present invention will be described in detail on the basis of Examples. However, it is to be understood that the present invention is not limited to Examples described below. Some of the materials used in any one of Examples and Comparative Examples described later are shown below.

[Constituent material of electron-blocking layer]
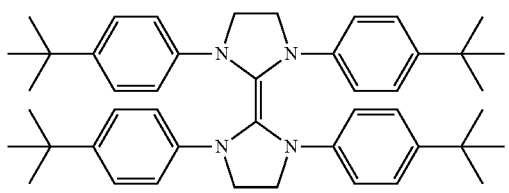
Y1
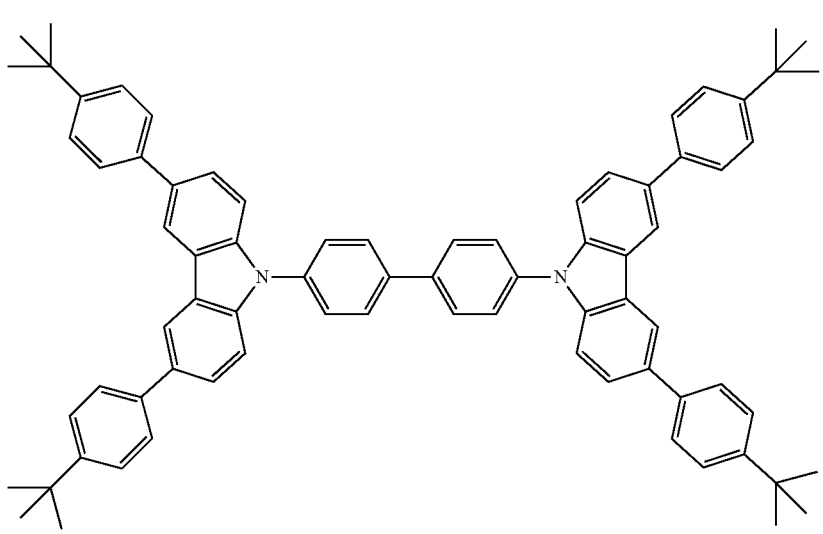
Y2
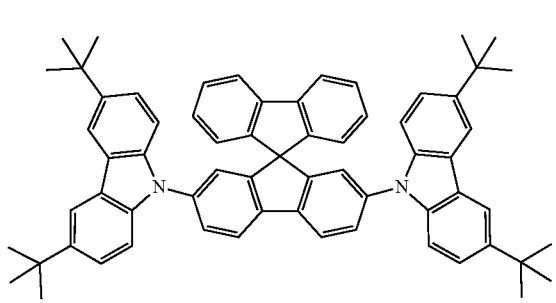
Y3
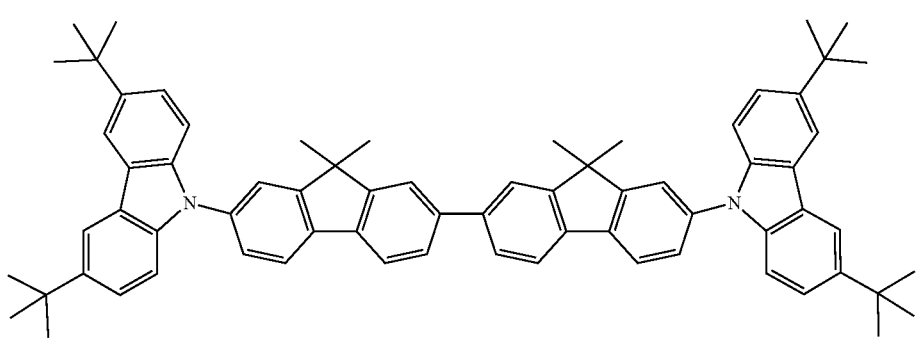
Y4

-continued

[Material used in Comparative Examples]

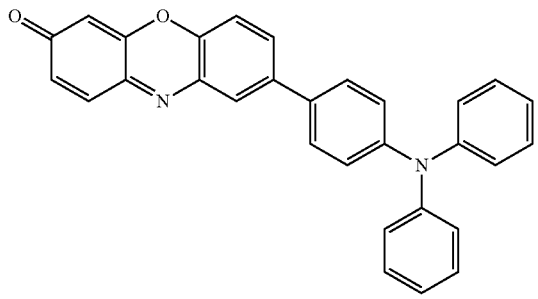

W1

Example 1

An organic photoelectric conversion element in which a hole-collecting electrode, an electron-blocking layer (second organic compound layer), a photoelectric conversion portion (first organic compound layer), a hole-blocking layer (third organic compound layer), and an electron-collecting electrode were disposed in this order on a substrate was produced by the method described below.

First, by depositing indium zinc oxide on a substrate (Si substrate), a conductive film was formed. The thickness of the conductive film was set at 100 nm. Then, by patterning the conductive film into a desired shape, a hole-collecting electrode was formed. The substrate provided with the hole-collecting electrode in such a manner was used as an electrode-attached substrate in the following step.

Next, organic compound layers and an electrode layer shown in Table 1 below were continuously formed on the electrode-attached substrate. Note that the electrode area of the counter electrode (electron-collecting electrode) was set to be 3 $mm^2$.

TABLE 1

|  | Constituent material | Thickness [nm] |
|---|---|---|
| Second organic compound layer | Y1 (Material Z1) | 50 |
| First organic compound layer | A16 (Material Z2, light-absorbing material), Fullerene C60 (Material Z3, photoelectric conversion-inducing material), (Z2:Z3 = 30:70 (weight ratio)) | 200 |
| Third organic compound layer | Fullerene C60 | 10 |
| Electron-collecting electrode | indium zinc oxide | 30 |

Thus, an organic photoelectric conversion element was obtained.

Examples 2 to 33, Comparative Examples 1 and 2

Organic photoelectric conversion elements were obtained as in Example 1 except that the materials Z1, Z2, and Z3 were changed as shown in Table 2 or 3.
[Evaluation of Organic Photoelectric Conversion Element]

Regarding the resulting elements, organic photoelectric conversion element characteristics were measured and evaluated. When the current under an applied voltage of 5 V was checked, in every element, the value "[current in the light]/[current in the dark]" was 100 (times) or more. Therefore, it was confirmed that the resulting element functioned as a photoelectric conversion element. Furthermore, when the resulting elements were applied with voltages of 1 to 10V, the conversion efficiency (internal quantum efficiency), i.e., photoelectric conversion capability at the absorption maximum wavelength at that time, was checked.

Element characteristics at the absorption maximum wavelength (conversion efficiency) in Examples and Comparative Examples are shown in Tables 2 and 3 below. When a voltage is applied to the elements, even under an applied voltage lower than 10 V, elements having high charge separation capability have a conversion yield that is close conversion efficiency under an applied voltage of 10V. Thus, conversion efficiency of the resulting elements were measured.

Note that, the conversion efficiency (internal quantum efficiency) can be obtained by calculating the ratio of external quantum efficiency to absorptance in the element. The absorptance in the element was calculated by measuring the transmittance and reflectance of the element at a wavelength of 550 nm by using a UV-vis spectrophotometer (device name: Solid Spec-3700, manufactured by Shimadzu Corporation). The light that is incident on a measurement sample (incident light) is divided into light that is transmitted through the sample (transmitted light), light that is absorbed by the sample (absorbed light), and light that is reflected by the sample (reflected light). Accordingly, by subtracting the percentage of incident light transformed into transmitted light (transmittance) and the percentage of incident light transformed into reflected light (reflectance) from the total incident light, it is possible to obtain the absorptance, i.e., the ratio of incident light transformed into absorbed light relative to the total incident light. The external quantum efficiency was calculated by measuring the photoelectric current density at the time when monochromatic light with an intensity of 50 $\mu W/cm^2$, corresponding to each wavelength, was applied to the element while applying a voltage of 5 or 10 V between the hole-collecting electrode and the electron-collecting electrode. Here, the photoelectric current density was obtained by subtracting the dark current density during light shielding from the current density during light irradiation. The monochromatic light used in the measurement of the photoelectric current density was obtained by monochromatization of the white light emitted from a xenon lamp (device name: XB-50101AA-A, manufactured by Ushio Inc.) by using a monochrometer (device name: MC-10N, manufactured by Ritsu Oyo Kougaku). Voltage application to the element and current measurement were performed by using a source meter (device name: R6243, manufactured by Advantest). Furthermore, in the measurement of the absorptance in the element and the external quantum efficiency, light was made incident perpendicularly on the element and from the upper electrode (electron-collecting electrode) side.

TABLE 2

|  | Z1 | Z2 | Z3 | Conversion efficiency (%) | |
|---|---|---|---|---|---|
|  |  |  |  | 5 V | 10 V |
| Example 1 | Y1 | A16 | C60 | 80 | 82 |
| Example 2 | Y4 | A23 | C60 | 76 | 78 |
| Example 3 | Y3 | B3 | C60 | 77 | 78 |
| Example 4 | Y3 | B11 | C60 | 80 | 80 |
| Example 5 | Y3 | B15 | C60 | 81 | 81 |
| Example 6 | Y2 | C6 | C60 | 82 | 82 |
| Example 7 | Y3 | C9 | C60 | 80 | 81 |
| Example 8 | Y1 | D6 | C60 | 80 | 81 |
| Example 9 | Y1 | E3 | C60 | 80 | 81 |
| Example 10 | Y1 | E5 | C60 | 82 | 82 |
| Example 11 | Y1 | F4 | C60 | 77 | 82 |
| Example 12 | Y1 | F7 | C60 | 80 | 81 |
| Example 13 | Y4 | G9 | C60 | 80 | 81 |
| Example 14 | Y1 | H1 | C60 | 82 | 82 |
| Example 15 | Y2 | H6 | C60 | 80 | 82 |
| Example 16 | Y2 | I1 | C60 | 79 | 81 |
| Example 17 | Y4 | I3 | C60 | 82 | 85 |
| Example 18 | Y2 | J3 | C60 | 80 | 81 |
| Example 19 | Y2 | J5 | C60 | 78 | 80 |
| Example 20 | Y4 | K1 | C60 | 80 | 82 |

TABLE 3

|  | Z1 | Z2 | Z3 | Conversion efficiency (%) | |
|---|---|---|---|---|---|
|  |  |  |  | 5 V | 10 V |
| Example 21 | Y2 | K6 | C60 | 77 | 82 |
| Example 22 | Y1 | L3 | C60 | 80 | 83 |
| Example 23 | Y1 | L7 | C60 | 82 | 85 |
| Example 24 | Y1 | M1 | C60 | 78 | 79 |
| Example 25 | Y1 | M3 | C60 | 82 | 84 |
| Example 26 | Y3 | N2 | C60 | 77 | 80 |
| Example 27 | Y1 | N4 | C60 | 82 | 84 |
| Example 28 | Y2 | O2 | C60 | 80 | 82 |
| Example 29 | Y2 | P1 | C60 | 82 | 85 |
| Example 30 | Y4 | P4 | C60 | 80 | 84 |
| Example 31 | Y2 | Q1 | C60 | 81 | 84 |
| Example 32 | Y2 | Q2 | C70 | 82 | 85 |
| Example 33 | Y3 | Q5 | C60 | 80 | 82 |
| Comparative Example 1 | Y2 | W1 | C70 | 20 | 40 |
| Comparative Example 2 | Y3 | W1 | C60 | 60 | 82 |

As is evident from Tables 2 and 3, in the photoelectric conversion elements of Examples in which the layer that performs photoelectric conversion contains a compound having a fluoranthene skeleton and a compound having a fullerene skeleton, the difference between the conversion efficiency at an applied voltage of 5 V and the conversion efficiency at an applied voltage of 10 V is within 10%. On the other hand, in the photoelectric conversion elements of Comparative Examples, the difference between the conversion efficiency at an applied voltage of 5 V and the conversion efficiency at an applied voltage of 10 V is larger than that in the photoelectric conversion elements of Examples. The reason for this is that since the fullerene contained in the first organic compound layer (photoelectric conversion portion) includes the fluoranthene skeleton, the fullerene causes interaction with the compound having the fluoranthene skeleton (material Z2), and thereby, charge separation is efficiently performed. As described above, by incorporating at least two compounds having a correlated structure into the first organic compound layer (photoelectric conversion portion) that performs photoelectric conversion, improvement in photoelectric conversion efficiency is achieved.

Example 34

In this example, a photoelectric conversion element in which a hole-collecting electrode, an electron-blocking layer (second organic compound layer), a photoelectric conversion portion (first organic compound layer), a hole-blocking layer (third organic compound layer), and an electron-collecting electrode were disposed in this order on a substrate was produced by the method described below.

First, by depositing indium zinc oxide on a substrate (Si substrate), a conductive film was formed. The thickness of the conductive film was set at 100 nm. Then, by patterning the conductive film into a desired shape, a hole-collecting electrode was formed. The substrate provided with the hole-collecting electrode (TiN electrode) in such a manner was used as an electrode-attached substrate in the following step. Next, organic compound layers and an electrode layer shown in Table 4 below were continuously formed on the electrode-attached substrate. Note that the electrode area of the counter electrode (electron-collecting electrode) was set to be 3 mm$^2$.

TABLE 4

|  | Constituent material | Thickness [nm] |
|---|---|---|
| Second organic compound layer | Y1 (Material Z1) | 50 |
| First organic compound layer | A22 (Material Z2, light-absorbing material), K1 (Material Z3, light-absorbing material) Fullerene C60 (Material Z4, photoelectric conversion-inducing material), (Z2:Z3:Z4 = 25:25:50 (weight ratio)) | 200 |
| Third organic compound layer | Fullerene C60 | 10 |
| Electron-collecting electrode | indium zinc oxide | 30 |

Thus, an organic photoelectric conversion element was obtained. Regarding the resulting element, organic photoelectric conversion element characteristics were measured and evaluated by the same methods as those in Example 1. The results are shown in Table 5.

Examples 35 and 36

Organic photoelectric conversion elements were obtained as in Example 1 except that the materials Z1, Z2, Z3, and Z4 were changed as shown in Table 5. Regarding the resulting elements, organic photoelectric conversion element characteristics were measured and evaluated by the same methods as those in Example 1. The results are shown in Table 5.

TABLE 5

|  | Z1 | Z2 | Z3 | Z4 | Conversion efficiency (%) 5 V | Conversion efficiency (%) 10 V |
|---|---|---|---|---|---|---|
| Example 34 | Y1 | A22 | K1 | C60 | 75 | 85 |
| Example 35 | Y3 | B15 | E1 | C60 | 70 | 79 |
| Example 36 | Y3 | A13 | M1 | C60 | 72 | 78 |

As is evident from Table 5, even when the layer that performs photoelectric conversion contains two or more light-absorbing materials, charge separation is efficiently performed as in the system containing one light-absorbing material. That is, even when two or more light-absorbing materials are mixed into the layer that performs photoelectric conversion, improvement in photoelectric conversion efficiency can be achieved.

In the organic photoelectric conversion element according to the present invention, two compounds (first compound and second compound) contained in at least the photoelectric conversion portion each have a fluoranthene structure, which is a common condensed ring structure. Therefore, according to the present invention, it is possible to provide an organic photoelectric conversion element having improved photoelectric conversion efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An organic photoelectric conversion element comprising:
   an anode;
   a cathode; and
   a photoelectric conversion portion which is disposed between the anode and the cathode,
   wherein the photoelectric conversion portion includes a first organic compound having at least a fullerene skeleton and a second organic compound having a fluoranthene skeleton, and
   wherein the second compound has a vinyl group provided that the second organic compound excludes a fluoranthene skeleton represented by general formulas (2) and (7) shown below:

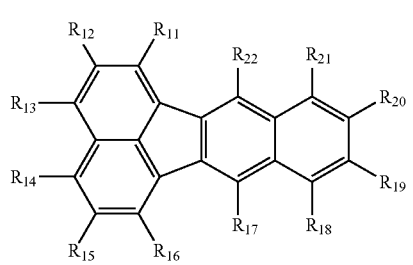

(2)

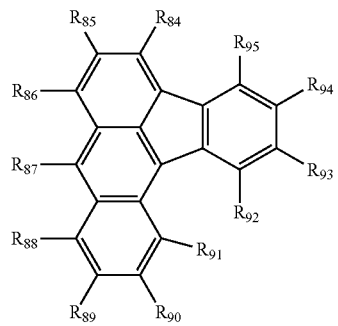

(7)

wherein, in formula (2), $R_{11}$ to $R_{22}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group:

wherein, in formula (7), $R_{54}$ to $R_{95}$ each represent a hydrogen atom, a fluorine atom, a substituted or unsubstituted alkyl group, a substituted or unsubstituted aryl group, a substituted or unsubstituted heterocyclic group, a vinyl group represented by general formula (I) below, a substituted or unsubstituted amino group, or a cyano group:

$$-CR_a=CR_bR_c \quad (I)$$

wherein, in formula (I), at least two substituents among $R_a$, $R_b$, and $R_c$ may combine to form a ring structure, wherein the vinyl group is a substituent represented by any one of general formulas (21) to (25) below:

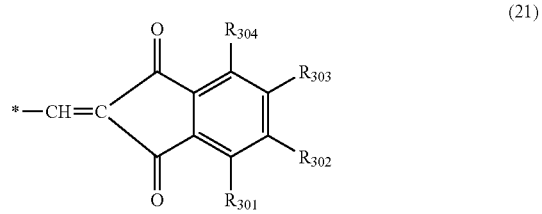

(21)

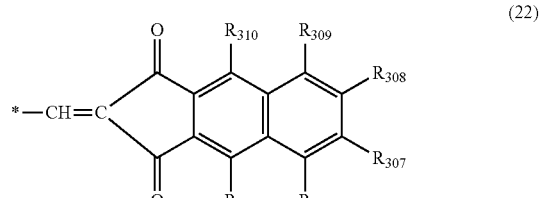

(22)

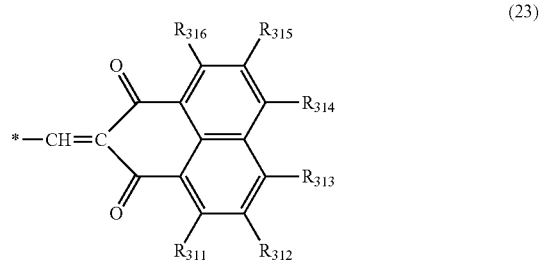

(23)

-continued

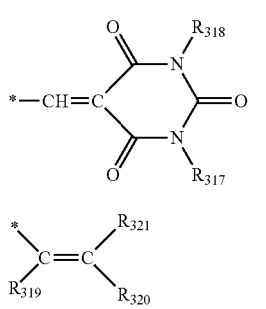
(24)

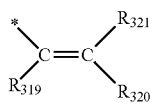
(25)

wherein, in formula (21), the asterisk represents a bond, and $R_{301}$ to $R_{304}$ each represent a hydrogen atom, an alkyl group, an aralkyl group, an aryl group, a heterocyclic group, an amino group, an alkoxy group, an aryloxy group, a halogen atom, or a cyano group;

wherein, in formula (22), the asterisk represents a bond, and $R_{305}$ to $R_{310}$ each represent a hydrogen atom, an alkyl group, an aralkyl group, an aryl group, a heterocyclic group, an amino group, an alkoxy group, an aryloxy group, a halogen atom, or a cyano group;

wherein, in formula (23), the asterisk represents a bond, and $R_{311}$ to $R_{316}$ each represent a hydrogen atom, an alkyl group, an aralkyl group, an aryl group, a heterocyclic group, an amino group, an alkoxy group, an aryloxy group, a halogen atom, or a cyano group;

wherein, in formula (24), the asterisk represents a bond, and $R_{317}$ and $R_{318}$ each represent a hydrogen atom, an alkyl group, an aralkyl group, an aryl group, a heterocyclic group, an amino group, an alkoxy group, an aryloxy group, a halogen atom, or a cyano group; and wherein, in formula (25), the asterisk represents a bond, and $R_{319}$ represents a hydrogen atom, an alkyl group, an aralkyl group, an aryl group, a heterocyclic group, an amino group, an alkoxy group, an aryloxy group, a halogen atom, or a cyano group, $R_{320}$ and $R_{321}$ each represent a cyano group.

2. The organic photoelectric conversion element according to claim 1, wherein the first organic compound is fullerene C60.

3. The organic photoelectric conversion element according to claim 1, wherein the second organic compound is a compound represented by any one of general formulas (1), (3) to (6), and (8) to (17) below:

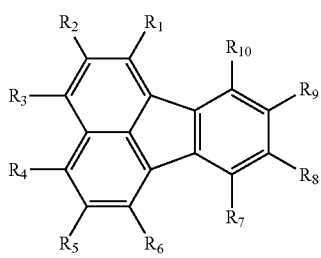
(1)

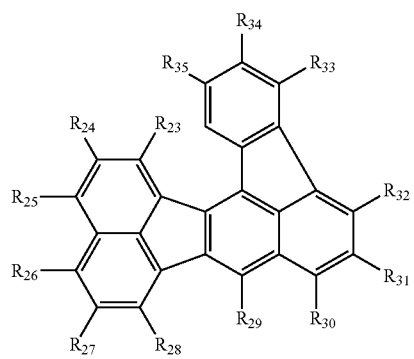
(3)

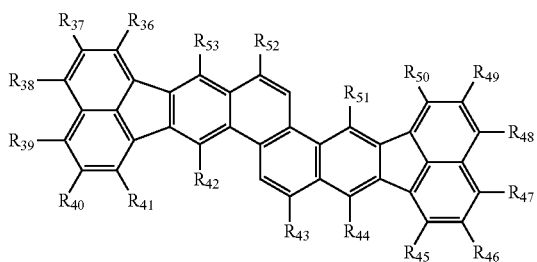
(4)

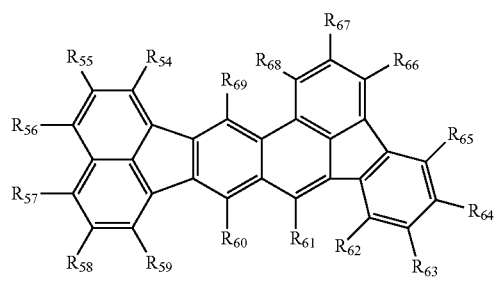
(5)

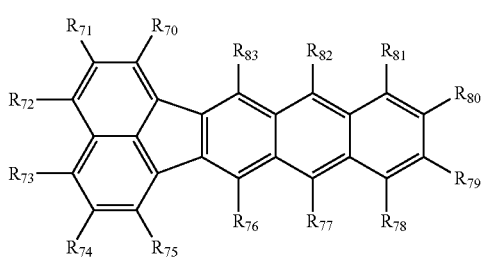
(6)

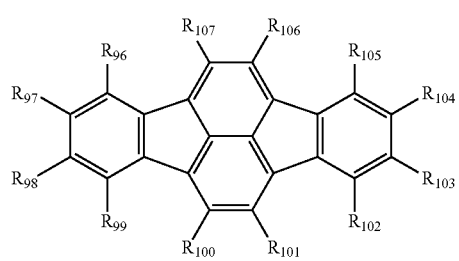
(8)

-continued
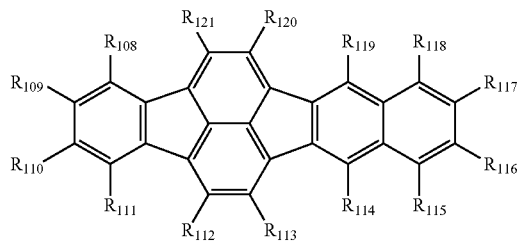 (9)
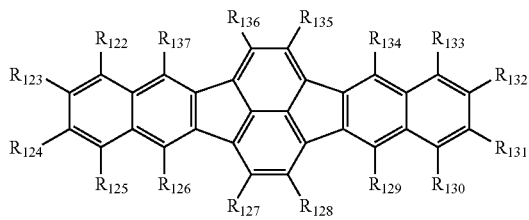 (10)
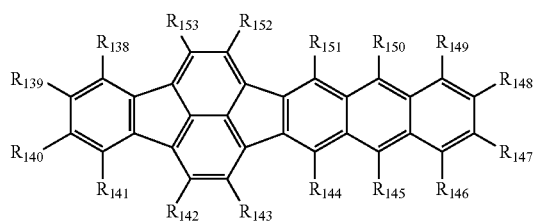 (11)
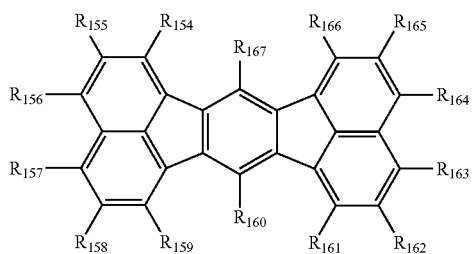 (12)
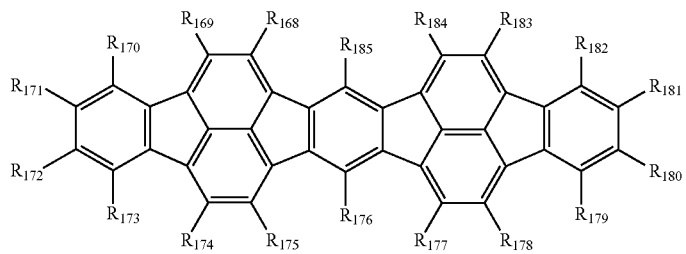 (13)
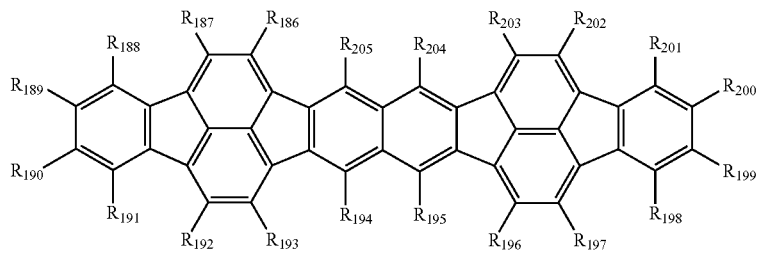 (14)
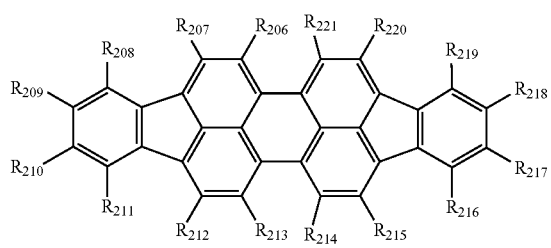 (15)
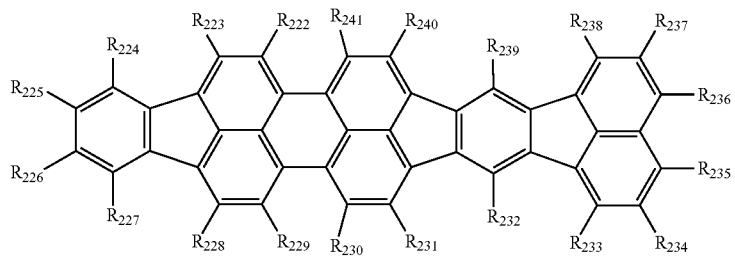 (16)

-continued

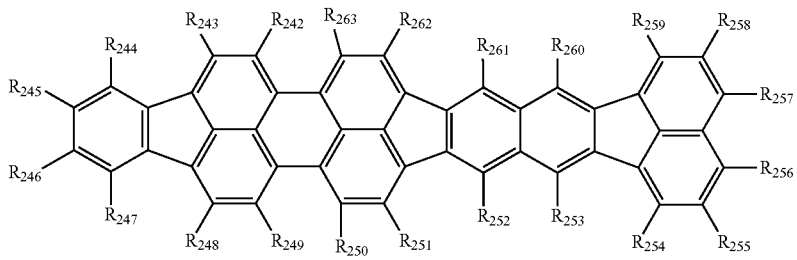

(17)

wherein, in formula (1), $R_1$ to $R_{10}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_3$, $R_4$, $R_8$ and $R_9$ represent the vinyl group;

wherein, in formula (3), $R_{23}$ to $R_{35}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{25}$, $R_{26}$, $R_{31}$ and $R_{32}$ represent the vinyl group;

wherein, in formula (4), $R_{36}$ to $R_{53}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{38}$, $R_{39}$, $R_{47}$ and $R_{48}$ represent the vinyl group;

wherein, in formula (5), $R_{54}$ to $R_{69}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{56}$, $R_{57}$, $R_{63}$ and $R_{64}$ represent the vinyl group;

wherein, in formula (6), $R_{70}$ to $R_{83}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{72}$, $R_{73}$, $R_{79}$ and $R_{80}$ are represent the vinyl group;

wherein, in formula (8), $R_{96}$ to $R_{107}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{97}$, $R_{98}$, $R_{103}$ and $R_{104}$ are represent the vinyl group;

wherein, in formula (9), $R_{108}$ to $R_{121}$ each represent a hydrogen atom, a fluorine atom, a substituted or unsubstituted alkyl group, a substituted or unsubstituted heterocyclic group, the vinyl group, a substituted or unsubstituted amino group, or a cyano group, at least one of the $R_{109}$, $R_{110}$, $R_{116}$ and $R_{117}$ are represent the vinyl group;

wherein, in formula (10), $R_{122}$ to $R_{137}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{123}$, $R_{124}$, $R_{131}$ and $R_{132}$ are represent the vinyl group;

wherein, in formula (11), $R_{138}$ to $R_{153}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{139}$, $R_{140}$, $R_{147}$ and $R_{148}$ are represent the vinyl group;

wherein, in formula (12), $R_{154}$ to $R_{167}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{156}$, $R_{157}$, $R_{163}$ and $R_{164}$ are represent the vinyl group;

wherein, in formula (13), $R_{168}$ to $R_{185}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{171}$, $R_{172}$, $R_{180}$ and $R_{181}$ are represent the vinyl group;

wherein, in formula (14), $R_{156}$ to $R_{205}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{189}$, $R_{190}$, $R_{199}$ and $R_{200}$ are represent the vinyl group;

wherein, in formula (15), $R_{206}$ to $R_{221}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{209}$, $R_{210}$, $R_{217}$ and $R_{218}$ are represent the vinyl group;

wherein, in formula (16), $R_{222}$ to $R_{241}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{225}$, $R_{226}$, $R_{235}$ and $R_{236}$ are represent the vinyl group; and wherein, in formula (17), $R_{242}$ to $R_{263}$ each represent a hydrogen atom, a fluorine atom, a substituted or unsubstituted alkyl group, a substituted or unsubstituted aryl group, a substituted or unsubstituted heterocyclic group, the vinyl group, a substituted or unsubstituted amino group, or a cyano group, at least one of the $R_{245}$, $R_{246}$, $R_{256}$ and $R_{257}$ are represent the vinyl group.

4. The organic photoelectric conversion element according to claim 1, wherein the photoelectric conversion portion further includes a third organic compound.

5. An optical area sensor comprising a plurality of organic photoelectric conversion elements, at least one of which is the organic photoelectric conversion element according to claim 1, wherein the plurality of the organic photoelectric conversion elements are two-dimensionally arranged in an in-plane direction.

6. An organic photoelectric conversion apparatus comprising a plurality of types of organic photoelectric conversion elements which receive light with different wavelengths, wherein among the plurality of types of organic photoelectric conversion elements, at least one type of organic photoelectric conversion element is the organic photoelectric conversion element according to claim 1; and
wherein the plurality of types of organic photoelectric conversion elements are stacked.

7. An optical area sensor comprising a plurality of organic photoelectric conversion apparatuses, at least one of which is the organic photoelectric conversion apparatus according to claim 6, wherein the plurality of the organic photoelectric conversion apparatuses are two-dimensionally arranged in the in-plane direction.

8. An image pickup device comprising:
a plurality of organic photoelectric conversion elements; and
a transistor connected to each of the organic photoelectric conversion elements,
wherein at least one of the organic photoelectric conversion elements is the organic photoelectric conversion element according to claim 1; and
wherein the organic photoelectric conversion elements are light receiving pixels.

9. The image pickup device according to claim 8, further comprising an optical filter disposed so as to correspond to the light receiving pixels.

10. The image pickup device according to claim 9, wherein the optical filter is either a low-pass filter that transmits wavelengths equal to or higher than infrared or a long pass filter that transmits wavelengths equal to or lower than ultraviolet.

11. The image pickup device according to claim 8, further comprising an optical member disposed so as to correspond to each of the light receiving pixels.

12. An image pickup apparatus comprising:
an image pickup optical system; and
an image pickup device which receives light that has passed through the image pickup optical system,
wherein the image pickup device is the image pickup device according to claim 8.

13. An image pickup apparatus comprising:
a joint portion that can be connected to an image pickup optical system; and
the image pickup device according to claim 8.

14. The image pickup apparatus according to claim 12, wherein the image pickup apparatus is a digital camera or digital still camera.

15. The image pickup apparatus according to claim 12, further comprising a receiving unit configured to receive a signal from outside,
wherein the signal is a signal that controls an image pickup range, image pickup start, or image pickup end of the image pickup apparatus.

16. The image pickup apparatus according to claim 12, further comprising a transmitting unit configured to transmit an obtained image to outside.

17. The organic photoelectric conversion element according to claim 3,
wherein the second compound is represented by any one of general formulas (8) to (17).

18. The organic photoelectric conversion according to claim 1,
wherein the second compound excludes a compound represented by the formula (15).

19. The organic photoelectric conversion according to claim 17,
wherein the second compound excludes a compound represented by the formula (15).

* * * * *